US 11,271,599 B2

(12) United States Patent
Mirea et al.

(10) Patent No.: US 11,271,599 B2
(45) Date of Patent: Mar. 8, 2022

(54) ENVELOPE TRACKING SYSTEM HAVING FAST TRANSITION TIME FOR A RADIO FREQUENCY (RF) AMPLIFIER

(71) Applicant: QUALCOMM INCORPORATED, San Diego, CA (US)

(72) Inventors: Iulian Mirea, San Diego, CA (US); Gerard James Wimpenny, Oundle (GB); Jingxue Lu, San Diego, CA (US); Jongshick Ahn, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/125,252

(22) Filed: Dec. 17, 2020

(65) Prior Publication Data

US 2021/0194517 A1 Jun. 24, 2021

Related U.S. Application Data

(60) Provisional application No. 62/950,662, filed on Dec. 19, 2019.

(51) Int. Cl.
*H03F 3/24* (2006.01)
*H04B 1/04* (2006.01)
*H03F 1/02* (2006.01)

(52) U.S. Cl.
CPC .............. *H04B 1/04* (2013.01); *H03F 1/0227* (2013.01); *H03F 3/24* (2013.01);
(Continued)

(58) Field of Classification Search
CPC ........ H02M 3/07; H02M 3/157; H02M 3/158; H02M 5/293; H03F 1/02; H03F 1/32;
(Continued)

(56) References Cited

U.S. PATENT DOCUMENTS

2005/0161733 A1   7/2005  Cho et al.
2013/0057200 A1*  3/2013  Potts ...................... H02J 50/80
                                                320/107
(Continued)

FOREIGN PATENT DOCUMENTS

EP        3562040 A1    10/2019

OTHER PUBLICATIONS

Ham J., et al., "CMOS Power Amplifier Integrated Circuit with Dual-Mode Supply Modulator for Mobile Terminals", IEEE Transactions on Circuits and Systems 1: Regular Papers, IEEE, US, vol. 63, No. 1, Jan. 2, 2016 (Jan. 2, 2016), pp. 157-167, XP011599973, ISSN: 1549-8328, DOI: 10.1109/TCSI.2015.2512703 [retrieved on Feb. 15, 2016] abstract; figure 4.

(Continued)

*Primary Examiner* — Shawkat M Ali
(74) *Attorney, Agent, or Firm* — Smith Tempel Blaha LLC/Qualcomm

(57) ABSTRACT

An envelope tracking system includes an envelope signal generator, a supply modulator coupled to the envelope signal generator, the supply modulator comprising a switching regulator path configured to provide an output voltage at an output node to a power amplifier when in an average power tracking (APT) mode, the switching regulator path configured to operate together with a linear path to provide the output voltage at the output node to the power amplifier when in an envelope tracking (ET) mode, a capacitor having a first and second terminal, the first terminal coupled to ground, a switch coupled between the output node and the second terminal of the capacitor, the switch being configured to selectively disconnect the capacitor from the output node, and a circuit coupled between the output node and the second terminal of the capacitor, the circuit comprising a bi-directional current-limiting switch, the circuit configured (Continued)

to charge or discharge the capacitor such that a voltage across the capacitor changes from a first voltage to a second voltage.

26 Claims, 12 Drawing Sheets

(52) U.S. Cl.
CPC .. *H03F 2200/102* (2013.01); *H03F 2200/451* (2013.01); *H04B 2001/0408* (2013.01)

(58) Field of Classification Search
CPC . H03F 1/0227; H03F 3/19; H03F 3/21; H03F 3/24; H03F 3/38; H03F 3/68; H03F 3/195; H03F 3/211; H03F 3/217; H03F 3/245; H03F 2200/102; H03F 2200/451; H03G 3/20; H03G 3/3042; H04B 1/02; H04B 1/04; H04B 1/40; H04B 1/0483; H04B 2001/0408
USPC ............... 330/10, 127, 136, 251, 260, 297; 375/262, 295–297; 455/84, 91, 102, 455/127.1
See application file for complete search history.

(56) References Cited

U.S. PATENT DOCUMENTS

| | | | |
|---|---|---|---|
| 2014/0225674 A1* | 8/2014 | Folkmann | H03F 1/0222 |
| | | | 330/297 |
| 2014/0306763 A1* | 10/2014 | Hong | H03F 1/0238 |
| | | | 330/291 |
| 2015/0188432 A1 | 7/2015 | Vannorsdel et al. | |
| 2015/0236652 A1 | 8/2015 | Yang et al. | |
| 2015/0244325 A1* | 8/2015 | Irvine | H03F 1/025 |
| | | | 375/238 |
| 2017/0005691 A1* | 1/2017 | Li | H04B 1/40 |
| 2017/0085176 A1* | 3/2017 | Mathe | H02M 3/158 |
| 2019/0253023 A1 | 8/2019 | Yang et al. | |
| 2020/0169232 A1* | 5/2020 | Goto | H03F 3/245 |

OTHER PUBLICATIONS

International Search Report and Written Opinion—PCT/US2020/065788—ISA/EPO—Apr. 6, 2021.

* cited by examiner

US 11,271,599 B2

ENVELOPE TRACKING SYSTEM HAVING FAST TRANSITION TIME FOR A RADIO FREQUENCY (RF) AMPLIFIER

RELATED APPLICATIONS

This application claims priority to and the benefit of U.S. Provisional Patent Application No. 62/950,662, entitled "ENVELOPE TRACKING SYSTEM HAVING FAST TRANSITION TIME FOR A RADIO FREQUENCY (RF) AMPLIFIER," filed Dec. 19, 2019, the contents of which are hereby incorporated herein by reference in its entirety as if fully set forth below and for all applicable purposes.

FIELD

The present disclosure relates generally to electronics, and more specifically to control circuits for power amplifiers.

BACKGROUND

In a radio frequency (RF) transceiver, a communication signal is typically amplified and transmitted by a transmit section. A transmit section may comprise one or more circuits that amplify and transmit the communication signal. The amplifier circuit or circuits may comprise one or more amplifier paths having one or more stages that may include one or more driver stages, one or more power amplifier stages, and one or more impedance matching circuits. The amplifier circuit or circuits may generally be called upon to provide different levels of power amplification over a wide bandwidth, while attempting to provide both efficiency and linearity for a variety of different transmission signals.

Power amplifier (PA) output is generally controlled based on a number of different factors, and in some cases, is controlled by a tracking power supply that provides a supply voltage to the power amplifier dependent on the PA output power. The tracking power supply may be implemented as an APT (Average Power Tracking) only supply modulator, in which the power amplifier is provided with a fixed voltage related to the average power amplifier output power, or as an ET (Envelope Tracking) supply modulator, which adds the capability to provide the power amplifier with a supply voltage related to the instantaneous power amplifier output power. Many ET supply modulators operate in either ET mode or APT mode at high power amplifier output powers, and in APT mode at low power amplifier output power. In some instances, the time allowed for a transition from one APT power level to another APT power level may be very short, on the order of one (1) microsecond (μs), or less. When the power transition time requirement approaches one (1) μs, conventional APT and ET supply modulators may struggle to achieve the desired output voltage in the allowed time.

SUMMARY

Various implementations of systems, methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the disclosure provides an envelope tracking system an envelope signal generator, a supply modulator coupled to the envelope signal generator, the supply modulator comprising a switching regulator path configured to provide an output voltage at an output node to a power amplifier when in an average power tracking (APT) mode, the switching regulator path configured to operate together with a linear path to provide the output voltage at the output node to the power amplifier when in an envelope tracking (ET) mode, a capacitor having a first and second terminal, the first terminal coupled to ground, a switch coupled between the output node and the second terminal of the capacitor, the switch being configured to selectively disconnect the capacitor from the output node, and a circuit coupled between the output node and the second terminal of the capacitor, the circuit comprising a bi-directional current-limiting switch, the circuit configured to charge or discharge the capacitor such that a voltage across the capacitor changes from a first voltage to a second voltage.

Another aspect of the disclosure provides a method for communication including providing a first voltage to a power amplifier using a switching regulator path, and when switching from the first voltage to a second voltage in a first mode, or when switching from the first mode to a second mode, using a linear path to provide the first voltage to the power amplifier while the switching regulator path is decoupled from an output capacitor.

Another aspect of the disclosure provides an envelope tracking system including an envelope signal generator, a supply modulator coupled to the envelope signal generator, the supply modulator comprising a switching regulator path configured to provide an output voltage to a power amplifier when in an average power tracking (APT) mode, the switching regulator path configured to operate together with a linear path to provide an output voltage to the power amplifier when in an envelope tracking (ET) mode, circuitry configured to activate elements associated with the ET mode prior to a symbol boundary based at least in part on a MIPI trigger, and a switch configured to disconnect an output capacitor that is charged to a first output voltage (APT) from the supply modulator while the output voltage is provided to the power amplifier in the ET mode.

Another aspect of the disclosure provides a method for communication, including providing a first voltage in a first mode to a power amplifier using a linear path, when switching from the first voltage to a second voltage in a second mode, using the linear path to provide the second voltage to the power amplifier while a switching regulator path is decoupled from an output capacitor and the switching regulator path charges the output capacitor to the second voltage, and when the output capacitor is charged to the second voltage, deactivating the linear path and coupling the switching regulator path to the output capacitor so that the switching regulator path provides the second voltage in the second mode.

BRIEF DESCRIPTION OF THE DRAWINGS

In the figures, like reference numerals refer to like parts throughout the various views unless otherwise indicated. For reference numerals with letter character designations such as "102a" or "102b", the letter character designations may differentiate two like parts or elements present in the same figure. Letter character designations for reference numerals may be omitted when it is intended that a reference numeral encompass all parts having the same reference numeral in all figures.

DETAILED DESCRIPTION

Figure 1:
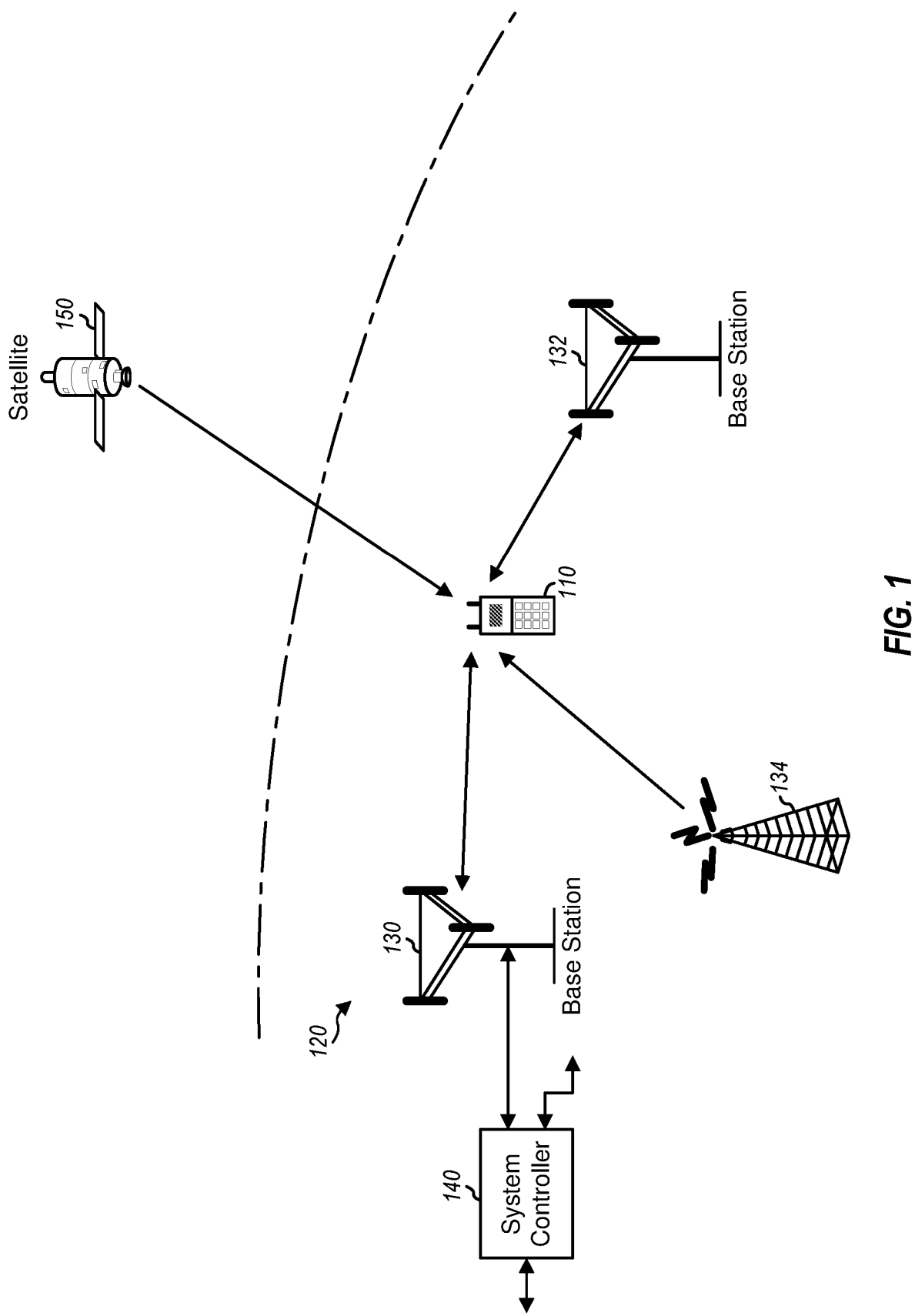
FIG. 1 is a diagram showing a wireless device communicating with a wireless communication system.

The word "exemplary" is used herein to mean "serving as an example, instance, or illustration." Any aspect described herein as "exemplary" is not necessarily to be construed as preferred or advantageous over other aspects.

Exemplary embodiments of the disclosure are directed to an envelope tracking system having a fast transition time for a radio frequency (RF) power amplifier. In an exemplary embodiment, the envelope tracking system may be configured to allow a power transition time on the order of one (1) µs, which may include a power transition time of less than one (1) µs, or more than one µs. For example, power transition time of less than one (1) µs to 1.5 µs, 2 µs, or between one (1) µs and ten (10) µs are contemplated. In an exemplary embodiment, the envelope tracking system described herein may be implemented in a new radio (NR), or a 5G communication system.

As portable communication systems evolve, the market continues to demand higher output power from amplifiers, and in particular, power amplifiers, and ever faster transition time from one power level to another. For example, in a 5G communication system, power transitions may occur on a symbol-by-symbol basis, thus demanding power level transitions to be completed in some cases in less than one (1) µs. Conventional envelope tracking systems often employ a switching regulator path and a linear path. In APT operating mode, the switching regulator path is configured to provide an average power tracking (APT) output voltage to a power amplifier. The switching regulator path in such conventional systems typically takes on the order of 10 µs to transition between the voltages required for different PA output powers due to the time required for the switching regulator to charge/discharge a large value output capacitor to the desired voltage. The switching regulator path operates efficiently, but may have low bandwidth and/or a slow settling time.

In envelope tracking (ET) operating mode, the linear path is used in conjunction with the switching regulator path to provide the power amplifier with a higher bandwidth supply voltage having faster settling time than the switching regulator path. In ET operating mode, the majority of the output power (at DC and low frequencies) is often provided by the efficient switching regulator path, and the high frequency energy is often provided by the less efficient linear path. The power conversion efficiency of the supply modulator may be higher in APT mode than in ET mode, but the output voltage settling time in ET mode may be lower than in APT mode. However, the efficiency of the PA at high output power is often higher in ET mode than in APT mode, hence overall battery current can often be reduced by using ET mode at high PA output powers and APT mode at low PA output powers.

Conventional APT supply modulators or ET supply modulators operating in APT mode may only be able to achieve APT mode-APT mode output voltage transition settling times on the order of 10 µs due to the output capacitor charging time limitation. In embodiments described herein, this limitation may be alleviated by switching the supply modulator from APT mode to ET mode during the time that the output capacitor is charging/discharging and then switching back to APT mode after the output capacitor settles at the desired voltage. The supply modulator output voltage is then able to settle to the desired voltage more quickly, for example in less than one (1) µs. The impact on supply modulator efficiency is reduced by only switching to ET mode when the output capacitor is being charged/discharged (which may be on the order of, for example, <10 µs).

FIG. 1 is a diagram showing a wireless device 110 communicating with a wireless communication system 120. The wireless communication system 120 may be a Long Term Evolution (LTE) system, a Code Division Multiple Access (CDMA) system, a Global System for Mobile Communications (GSM) system, a wireless local area network (WLAN) system, a 5G system, or some other wireless system. A CDMA system may implement Wideband CDMA (WCDMA), CDMA 1x, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless communication system may include any number of base stations and any set of network entities.

The wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a tablet, a cordless phone, a medical device, a drone, a vehicle, a wearable device, a device configured to connect to one or more other devices (for example through the internet of things), a wireless local loop (WLL) station, a Bluetooth device, etc. Wireless device 110 may communicate with wireless communication system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1x, EVDO, TD-SCDMA, GSM, 802.11, 5G, etc.

Wireless device 110 may support carrier aggregation, for example as described in one or more LTE or 5G standards. In some embodiments, a single stream of data is transmitted over multiple carriers using carrier aggregation, for example as opposed to separate carriers being used for respective data streams. Wireless device 110 may be able to operate in a variety of communication bands including, for example, those communication bands used by LTE, WiFi, 5G or other communication bands, over a wide range of frequencies.

In general, carrier aggregation (CA) may be categorized into two types—intra-band CA and inter-band CA. Intra-band CA refers to operation on multiple carriers within the same band. Inter-band CA refers to operation on multiple carriers in different bands.

Figure 2:
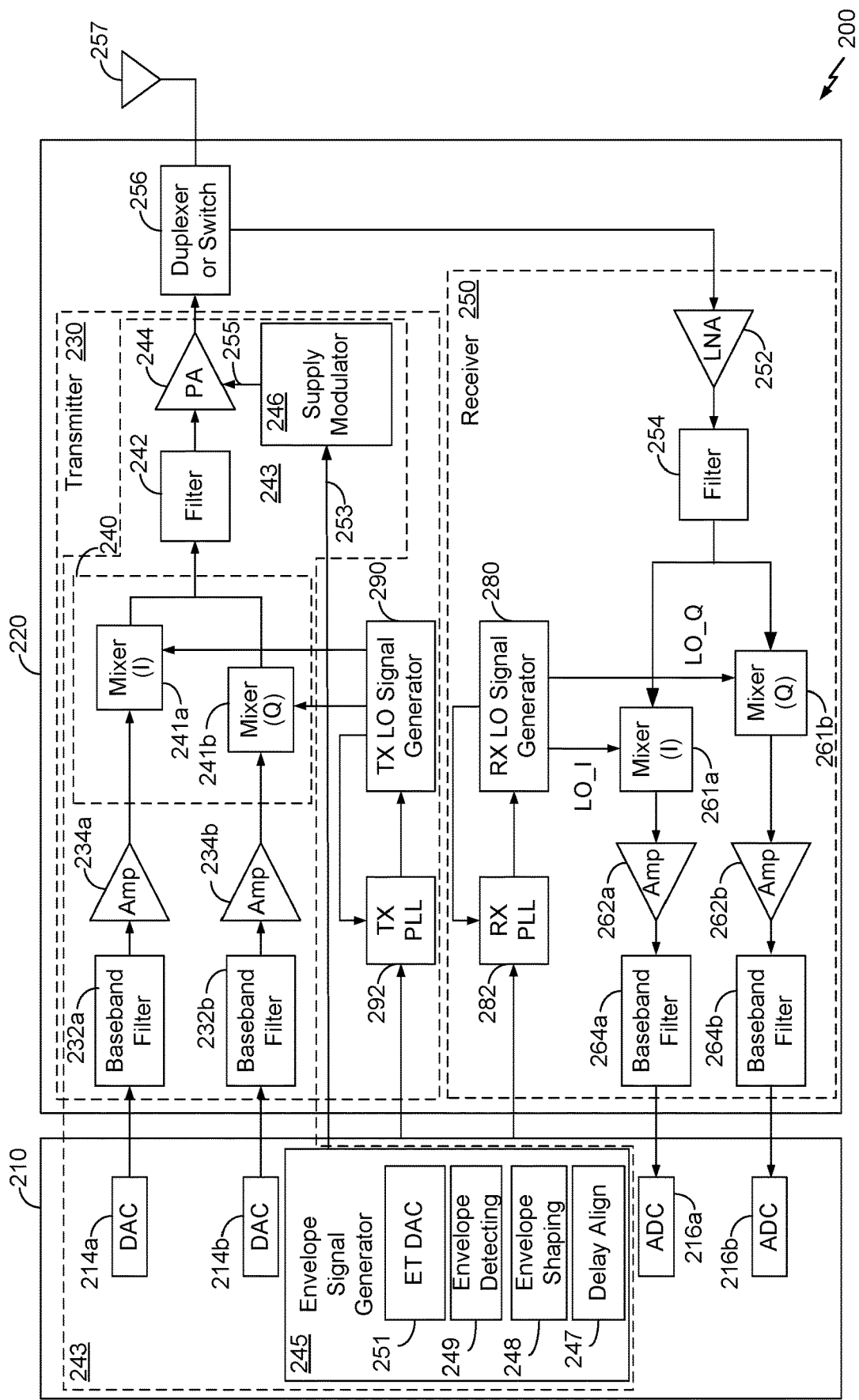
FIG. 2 is a block diagram showing a wireless device in which the exemplary techniques of the present disclosure may be implemented.

FIG. 2 is a block diagram showing a wireless device 200 in which the exemplary techniques of the present disclosure may be implemented. The wireless device 200 may, for example, be an embodiment of the wireless device 110 illustrated in FIG. 1. In some embodiments, the wireless device 200 may be an embodiment of base station 130 or 132, or the transmit portion of the wireless device 200 may be implemented in broadcast station 134).

FIG. 2 shows an example of a transceiver 220 having a transmitter 230 and a receiver 250. In general, the conditioning of the signals in the transmitter 230 and the receiver 250 may be performed by one or more stages of amplifier, filter, upconverter, downconverter, etc. These circuit blocks may be arranged differently from the configuration shown in FIG. 2. Furthermore, other circuit blocks not shown in FIG. 2 may also be used to condition the signals in the transmitter 230 and receiver 250. Unless otherwise noted, any signal in FIG. 2, or any other figure in the drawings, may be either single-ended or differential. Some circuit blocks in FIG. 2 may also be omitted.

In the example shown in FIG. 2, wireless device 200 generally comprises the transceiver 220 and a data processor 210. The data processor 210 may include a memory (not shown) to store data and program codes, and may generally comprise analog and/or digital processing elements. The transceiver 220 includes a transmitter 230 and a receiver 250 that support bi-directional communication. In general, wireless device 200 may include any number of transmitters and/or receivers for any number of communication systems and frequency bands. All or a portion of the transceiver 220 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the example shown in FIG. 2, transmitter 230 and receiver 250 are implemented with the direct-conversion architecture.

In the transmit path, the data processor 210 processes data to be transmitted and provides in-phase (I) and quadrature (Q) analog output signals to the transmitter 230. In an exemplary embodiment, the data processor 210 includes digital-to-analog-converters (DAC's) 214a and 214b for converting digital signals generated by the data processor 210 into the I and Q analog output signals, e.g., I and Q output currents, for further processing. In other embodiments, the DACs 214a and 214b are included in the transceiver 220 and the data processor 210 provides data (e.g., for I and Q) to the transceiver 220 digitally.

Within the transmitter 230, lowpass filters 232a and 232b filter the I and Q analog transmit signals, respectively, to remove undesired images caused by the prior digital-to-analog conversion. Amplifiers (Amp) 234a and 234b amplify the signals from lowpass filters 232a and 232b, respectively, and provide I and Q baseband signals. An upconverter 240 upconverts the I and Q baseband signals with I and Q transmit (TX) local oscillator (LO) signals from a TX LO signal generator 290 and provides an upconverted signal. A filter 242 filters the upconverted signal to remove undesired images caused by the frequency upconversion as well as noise in a receive frequency band. A power amplifier (PA) 244 amplifies the signal from filter 242 to obtain the desired output power level and provides a transmit RF signal. The transmit RF signal is routed through a duplexer or switch 256 and transmitted via an antenna 257. While examples discussed herein utilize I and Q signals, those of skill in the art will understand that elements of the transceiver may be configured to utilize polar modulation.

In an exemplary embodiment, the wireless device 200 may include an envelope tracking system 243. The envelope tracking system 243 is illustratively shown as having components, elements, circuitry, and other functionality that may be located in the data processor 210 and in the transmitter 230. In an exemplary embodiment, the envelope tracking system 243 may comprise an envelope signal generator 245, shown for exemplary purposes in the data processor 210, and a supply modulator 246 shown for exemplary purposes in the transmitter 230. In an exemplary embodiment, the envelope tracking system 243 may comprise some or all of the components in the transmitter 230 as shown in FIG. 2.

In an exemplary embodiment, the envelope signal generator 245 can include elements that can be configured to generate a signal on connection 253 representing a power level to be supplied to the power amplifier 244. The signal generated by the envelope signal generator 245 may be a voltage signal or a current signal, depending on implementation. In an exemplary embodiment, the envelope signal generator 245 may comprise a delay/align function 247, an envelope shaping element 248, an envelope detecting element 249 and an envelope tracking (ET) DAC 251. The envelope detecting element 249 determines the amplitude of the RF signal from the I and Q signals. The envelope shaping element 248 applies a non-linear function to the raw output of the envelope detecting element 249 to prevent the processed envelope signal on connection 253 from falling below a prescribed minimum voltage (often of the order 1V) or a prescribed minimum current. In some exemplary embodiments, the ET DAC 251 provides an analog representation as a signal on connection 253 (for example, as a differential voltage) of the digital envelope voltage generated by the envelope detecting element 249 and envelope shaping element 248. A delay/align element 247 adjusts the relative delay between the RF path signals and the envelope path signals to ensure that the RF signal at the PA 244 and the voltage output on connection 255 of the supply modulator 246 are precisely time aligned.

In an exemplary embodiment, and as will be described below, the supply modulator 246 may comprise a switching regulator path, a linear path, and related circuitry configured to receive the signal on connection 253 and to provide a supply voltage corresponding to the target output power to the PA 244 over connection 255.

In some embodiments, the supply modulator 246 may be implemented in a chip including a microcontroller; the chip may be mounted on a PCB on which other transmitter 230 elements, or RF front end elements (e.g., the duplexer or switch 256, filter 242 or 254, or other non-illustrated elements) are mounted and the microcontroller may be used to adjust the PA 244 and one or more of the other front end elements.

In the receive path, antenna 257 receives communication signals and provides a received RF signal, which is routed through duplexer or switch 256 and provided to a low noise amplifier (LNA) 252. The duplexer or switch 256 is designed to operate with a specific RX-to-TX duplexer frequency separation, such that RX signals are isolated from TX signals. The received RF signal is amplified by LNA 252 and filtered by a filter 254 to obtain a desired RF input signal. Downconversion mixers 261a and 261b mix the output of filter 254 with I and Q receive (RX) LO signals (i.e., LO_I and LO_Q) from an RX LO signal generator 280 to generate I and Q baseband signals. The I and Q baseband signals are amplified by amplifiers 262a and 262b and further filtered by lowpass filters 264a and 264b to obtain I and Q analog input signals, which are provided to data processor 210. In the exemplary embodiment shown, the data processor 210 includes analog-to-digital-converters (ADC's) 216a and 216b for converting the analog input signals into digital signals to be further processed by the data processor 210. In some embodiments, the ADCs 216a and 216b are included in the transceiver 220 and provide data to the data processor 210 digitally. Similarly, the ET DAC 251 may be implemented in the transceiver 220 and may be configured to receive information from the data processor 210 digitally and provide an analog signal over connection 253 to the supply modulator 246.

In FIG. 2, TX LO signal generator 290 generates the I and Q TX LO signals used for frequency upconversion, while RX LO signal generator 280 generates the I and Q RX LO signals used for frequency downconversion. Each LO signal is a periodic signal with a particular fundamental frequency. A phase locked loop (PLL) 292 receives timing information from data processor 210 and generates a control signal used to adjust the frequency and/or phase of the TX LO signals from LO signal generator 290. Similarly, a PLL 282 receives timing information from data processor 210 and generates a control signal used to adjust the frequency and/or phase of the RX LO signals from LO signal generator 280.

Wireless device 200 may support CA and may (i) receive multiple downlink signals transmitted by one or more cells on multiple downlink carriers at different frequencies and/or (ii) transmit multiple uplink signals to one or more cells on multiple uplink carriers. Those of skill in the art will understand, however, that aspects described herein may be implemented in systems, devices, and/or architectures that do not support carrier aggregation.

Certain elements of the transceiver 220 are functionally illustrated in FIG. 2, and the configuration illustrated therein may or may not be representative of a physical device configuration in certain implementations. For example, as described above, transceiver 220 may be implemented in various integrated circuits (ICs), RF ICs (RFICs), mixed-signal ICs, etc. In some embodiments, the transceiver 220 is implemented on a substrate or board such as a printed circuit board (PCB) having various modules. For example, the power amplifier 244, the filter 242, supply modulator 246, and the duplexer or switch 256 may be implemented in separate modules or as discrete components, while the remaining elements illustrated in the transceiver 220 may be implemented in a single transceiver chip.

The power amplifier 244 may comprise one or more stages comprising, for example, driver stages, power amplifier stages, or other components, that can be configured to amplify a communication signal on one or more frequencies, in one or more frequency bands, and at one or more power levels. Depending on various factors, the power amplifier 244 can be configured to operate using one or more driver stages, one or more power amplifier stages, one or more impedance matching networks, and can be configured to provide linearity, efficiency, or a combination of linearity and efficiency.

It is generally desirable for a power amplifier circuit to provide linear power amplification over a desired bandwidth, which may be a wide bandwidth, support high data rate transmission, provide high efficiency over the desired power output range and bandwidth, and support multiple power modes.

Figure 3:
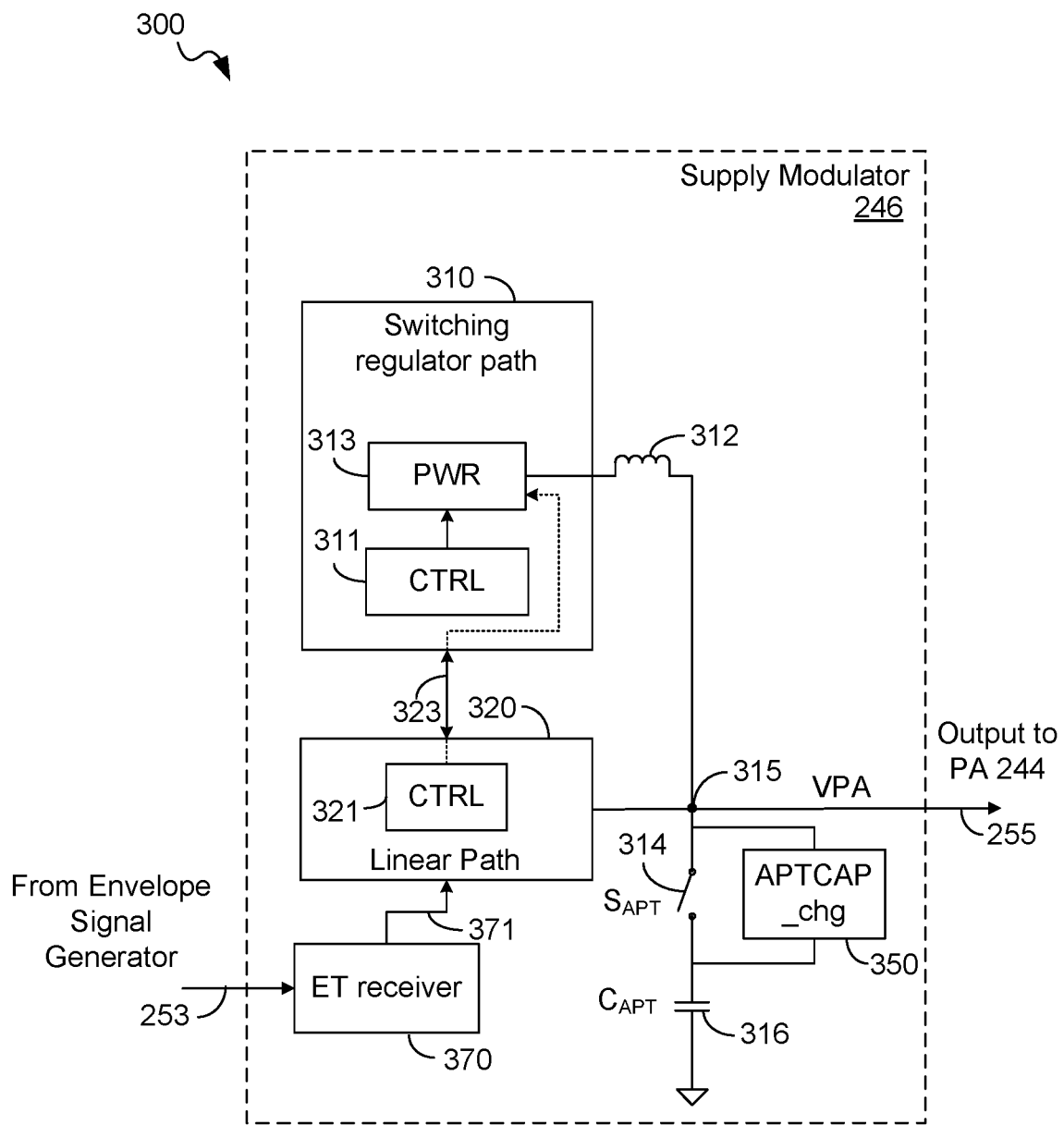
FIG. 3 is a schematic diagram illustrating an exemplary embodiment of the supply modulator of FIG. 2.

FIG. 3 is a schematic diagram 300 illustrating an exemplary embodiment of the supply modulator 246 of FIG. 2. In an exemplary embodiment, the supply modulator 246 comprises an ET receiver 370, a switching regulator path 310 and a linear path 320. The supply modulator 246 also comprises an inductor 312, a switch 314, a capacitor 316 and a charging circuit 350. In an exemplary embodiment, as will be described further below, the charging circuit 350 may be implemented as a bi-directional current limiting switch that may be configured to charge or discharge the capacitor 316 based on a maximum and minimum current. The switch 314 may be controlled by a signal from the data processor 210 (FIG. 2) or from another controller. In an exemplary embodiment, the ET receiver 370, the switching regulator path 310, the linear path 320, the charging circuit 350, and the switch 314 may be fabricated as circuitry on a die, while the inductor 312 and the capacitor 316 may be discrete components located on a printed circuit board (PCB). The capacitor 316 may be referred to as an "APT cap" ($C_{APT}$), or an APT capacitor, as it filters the voltage provided by the switching regulator path 310. The capacitor 316 may have a first terminal that may be coupled to system ground and may have a second terminal that may be coupled the switch 314, and to the charging circuit 350. The capacitor 316 may also be selectively coupled to the node 315 through the switch 314. The switch 314 may be referred to as an "APT switch" ($S_{APT}$), or an APT switch.

In an exemplary embodiment, the ET receiver 370 in the supply modulator 246 receives a signal over connection 253 from the envelope signal generator 245 (FIG. 2). The ET receiver 370 provides a signal to the linear path 320 over connection 371. The supply modulator 246 provides a voltage output to a power amplifier (such as the PA 244 of FIG. 2) over connection 255. The voltage at node 315 may be tightly regulated by the supply modulator 246 and may be directly connected to the PA supply feed on connection 255.

In an exemplary embodiment, the output of the ET receiver 370 on connection 371 may be a current that is provided to the liner path 320 to control the voltage at node 315.

When operating in average power tracking (APT) mode, the switch 314 is closed and a square wave output of the switching regulator path 310 is filtered by the inductor 312 and APT capacitor ($C_{APT}$) 316 to provide a regulated DC voltage at node 315 (VPA). The voltage VPA (power amplifier supply voltage) refers to the signal provided to the supply of the power amplifier 244. In APT mode, the linear path 320 is off and remains in a high-impedance state, so it does not influence the voltage at the node 315.

When the supply modulator 246 operates in envelope tracking (ET) mode, the switch 314 is opened and both the linear path 320 and the switching regulator path 310 are active. The linear path 320 amplifies the voltage from the envelope signal generator (245, FIG. 2) on connection 253 to provide a regulated output voltage (VPA) at the node 315. The switching regulator path 310 may be controlled by the linear path 320 over connection 323 and may be configured to provide the majority of the output power (DC and low frequency power), for example with high efficiency. In an exemplary embodiment, the switching regulator path 310 comprises a controller 311 and a power stage 313, where the controller 311 provides a "duty-cycle" input to the power stage 313 in the form of one or more (e.g., digital) signals with a controlled duty cycle depending on whether the power stage 313 has two or more switching levels. When the linear path 320 is controlling the switching regulator path 310, the duty-cycle control of the power stage 313 of the switching regulator path 310 may be controlled via connection 323 by a controller 321 in the linear path 320 instead of the controller 311 in the switching regulator path 310, as illustrated by the dotted connection from connection 323 to the power stage 313. In some embodiments, an output of the linear path 320 or a lead which is otherwise coupled to the node 315 may be coupled to the controller 311 to enable the switching regulator path 310 to be controlled based on a signal on the output or lead. The linear path 320 may be configured to provide the high frequency AC power, but may have lower efficiency than the switching regulator path 310 in some embodiments.

In a conventional supply modulator, the charging circuit 350 is not present and the APT capacitor 316 is directly charged/discharged by the switching regulator path 310 (via switch 314) when a change in APT mode output voltage is desired.

In accordance with an exemplary embodiment, when making an APT-APT voltage transition from an initial, or first, voltage, $V_{APT}1$, to a final, or second, voltage $V_{APT}2$ with the exemplary embodiment shown in FIG. 3, the APT capacitor 316 is disconnected from the output of the supply modulator 246 by the APT switch 314 and the supply modulator 246 is temporarily switched to ET operating mode, where the linear path 320 provides the initial APT voltage ($V_{APT}1$). A fast transition of the output voltage at node 315 (VPA) to the final APT voltage ($V_{APT}2$) is then possible because the ET mode has a very fast settling time. While the linear path 320 is providing the voltage to the node 315, the APT capacitor 316 is charged/discharged to the second, or final voltage, $V_{APT}2$ by the charging circuit 350 while disconnected from the output of the supply modulator 246 at the node 315 by the APT switch 314 being open. Once the voltage across the APT capacitor 316 is equal to $V_{APT}2$, the APT capacitor 316 is reconnected to the output of the supply modulator 246 by closing the APT switch 314, and the operating mode of the supply modulator 246 is changed from ET mode back to APT mode, while the switching regulator path 310 now provides the final voltage $V_{APT}2$ at node 315. In this way, a fast voltage change, or transition, from the first voltage, $V_{APT}1$, to the second voltage, $V_{APT}2$, is achieved. The efficiency of the supply modulator 246 may be lower when it is temporarily in ET mode (also referred to as ET transient mode), but this may have little effect on the overall APT efficiency as the percentage of time spend in the transient ET mode relative to the APT mode is small.

A similar process may be implemented to achieve fast ET-APT voltage transition. In such a case the output voltage transitions from the envelope modulated voltage during ET mode to the voltage $V_{APT}$ in APT mode. However, the initial voltage across the APT capacitor 316, which may be referred to as $V_{APT\_initial}$ ($V_{APT}1$), could be very different than the desired voltage $V_{APT\_final}$ ($V_{APT}2$). The voltage transition across the APT capacitor 316 from $V_{APT}1$ to $V_{APT}2$ will pose the same challenge as in APT-APT voltage transition and the solution is similar. During ET-APT mode transition, the supply modulator 246 remains in ET mode while providing the $V_{APT}$ voltage $V_{APT}2$ to the node 315. During that time, the charging circuit 350 will charge or discharge the APT capacitor 316 from $V_{APT}1$ to $V_{APT}2$. After the APT capacitor 316 reaches the voltage, $V_{APT}2$, the supply modulator 246 transitions into APT mode where the switching regulator path 310 provides the output $V_{APT}2$ to the node 315.

Figure 4:
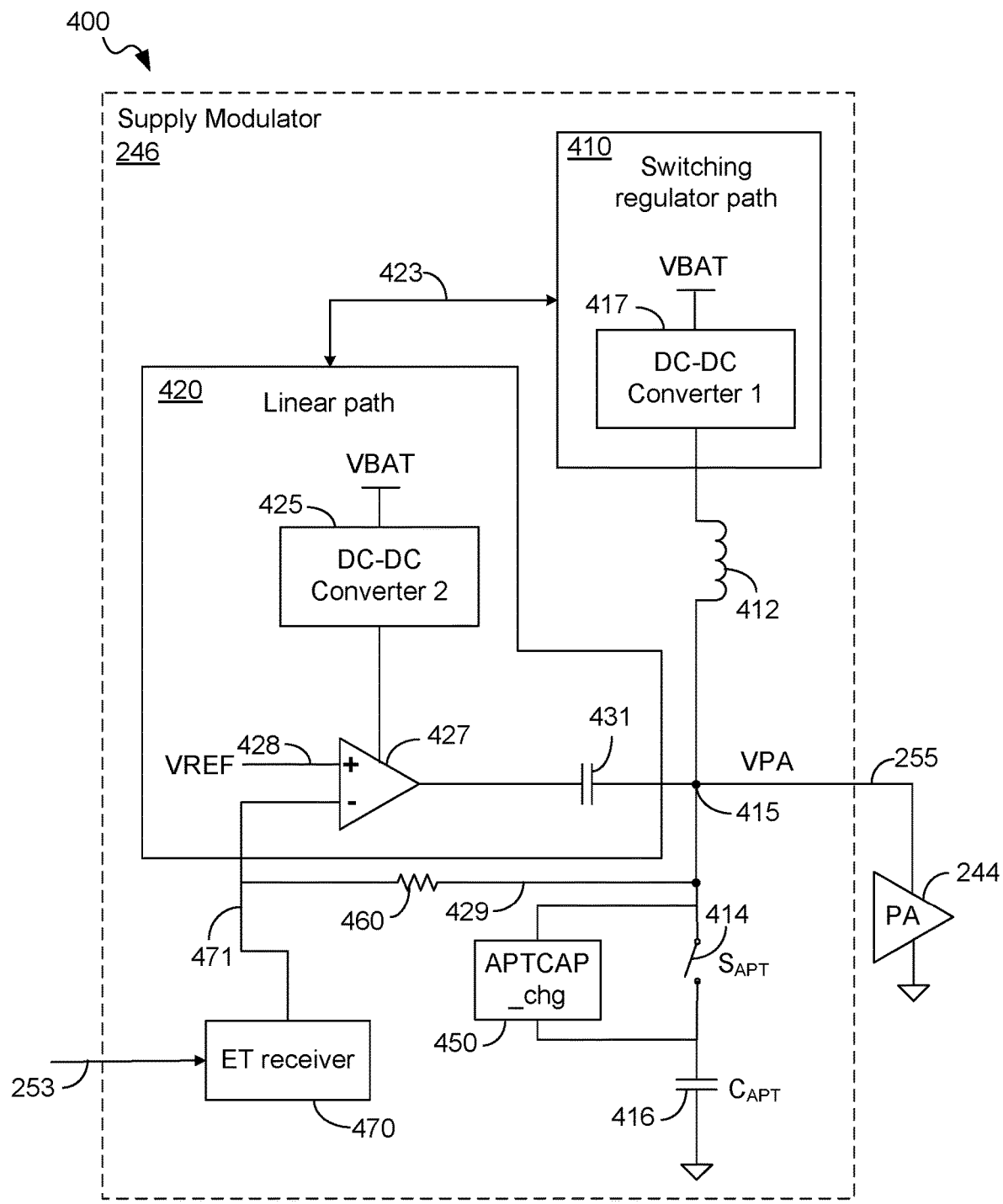
FIG. 4 is a schematic diagram illustrating an exemplary embodiment of the supply modulator of FIG. 3 in greater detail.

FIG. 4 is a schematic diagram 400 illustrating an exemplary embodiment of the supply modulator 246 of FIG. 3 in greater detail. In an exemplary embodiment, a switching regulator path 410 is an exemplary embodiment of the switching regulator path 310 of FIG. 3. In an exemplary embodiment, the switching regulator path 410 comprises a first DC-DC converter 417 coupled to a system or battery voltage, VBAT. The first DC-DC converter 417 provides a voltage output to the inductor 412, which is coupled to the node 415. In an exemplary embodiment, the first DC-DC converter 417 may be a multi-level buck converter configured to be supplied from the voltage VBAT, or selectively supplied by VBAT and a boosted voltage that may be higher than VBAT. In an exemplary embodiment, the voltage VPA may be higher than the voltage VBAT so that the first DC-DC converter 417 may be configured to provide a voltage higher than VBAT.

In an exemplary embodiment, the supply modulator 246 includes an ET receiver 470 configured to receive a signal over connection 253 from the envelope signal generator 245 (FIG. 2). The ET receiver 470 provides a signal to the linear path 420 over connection 471. In an exemplary embodiment, the signal on connection 471 may be a current that will flow through a resistor 460, thereby contributing to control of the voltage at the node 415 (VPA).

In an exemplary embodiment, a linear path 420 is an exemplary embodiment of the linear path 320 of FIG. 3. In an exemplary embodiment, the linear path 420 comprises a second DC-DC converter 425 coupled to a system or battery voltage, VBAT, an amplifier 427 and a capacitor 431. In an alternative exemplary embodiment, the capacitor 431 could be optional or the DC-DC converter 425 may also be (selectively or persistently) supplied by a boosted voltage that may be higher voltage than VBAT. A reference voltage is provided to the non-inverting input of the amplifier 427 over connection 428. The node 415 is coupled to the inverting input of the amplifier 427 over connection 429. High frequency AC power provided by the amplifier 427 may be combined with the DC/low frequency power provided by the switching regulator path 410 at the node 415. The output at the node 415 (VPA) may be tightly controlled to provide the supply voltage to the PA 244 via connection 255. The efficiency of the linear path 420 may be improved by maintaining a DC voltage across the capacitor 431, thereby allowing the amplifier 427 to operate from a lower supply voltage than would be possible if a DC combiner were used. The DC voltage across the capacitor 431 may be regulated by a controller in the linear path 420 (similar to the controller 321 in FIG. 3, and/or by the data processor 210 or another controller) that provides the "duty-cycle" control to the switching regulator path 410 over connection 423, for example to ensure that the average current provided through the inductor 412 is equal to an average load current drawn by the PA 244, similar to connection 323 described in FIG. 3. In such embodiment, zero average current may flow through the capacitor 431 and therefore the voltage across the capacitor 431 remains at a constant controlled voltage. In some embodiments, connection 423 is coupled to a node between the amplifier 427 and the capacitor 431, and to the first DC-DC converter 417 or to a element, such as a driver, which may provide "duty-cycle" control within or to the first DC-DC converter 417.

The supply modulator 246 includes an exemplary embodiment of the charging circuit 450, switch 414 and a capacitor 416. The capacitor 416 may be referred to as an "APT cap" ($C_{APT}$), or APT capacitor, as it filters the voltage provided by the switching regulator path 410. The capacitor 416 may have a first terminal that may be coupled to system ground and may have a second terminal that may be coupled the switch 414, and to the charging circuit 450. The capacitor 416 may also be selectively coupled to the node 415 through the switch 414. The switch 414 may be referred to as an "APT switch" ($S_{APT}$), or an APT switch.

Figure 5:
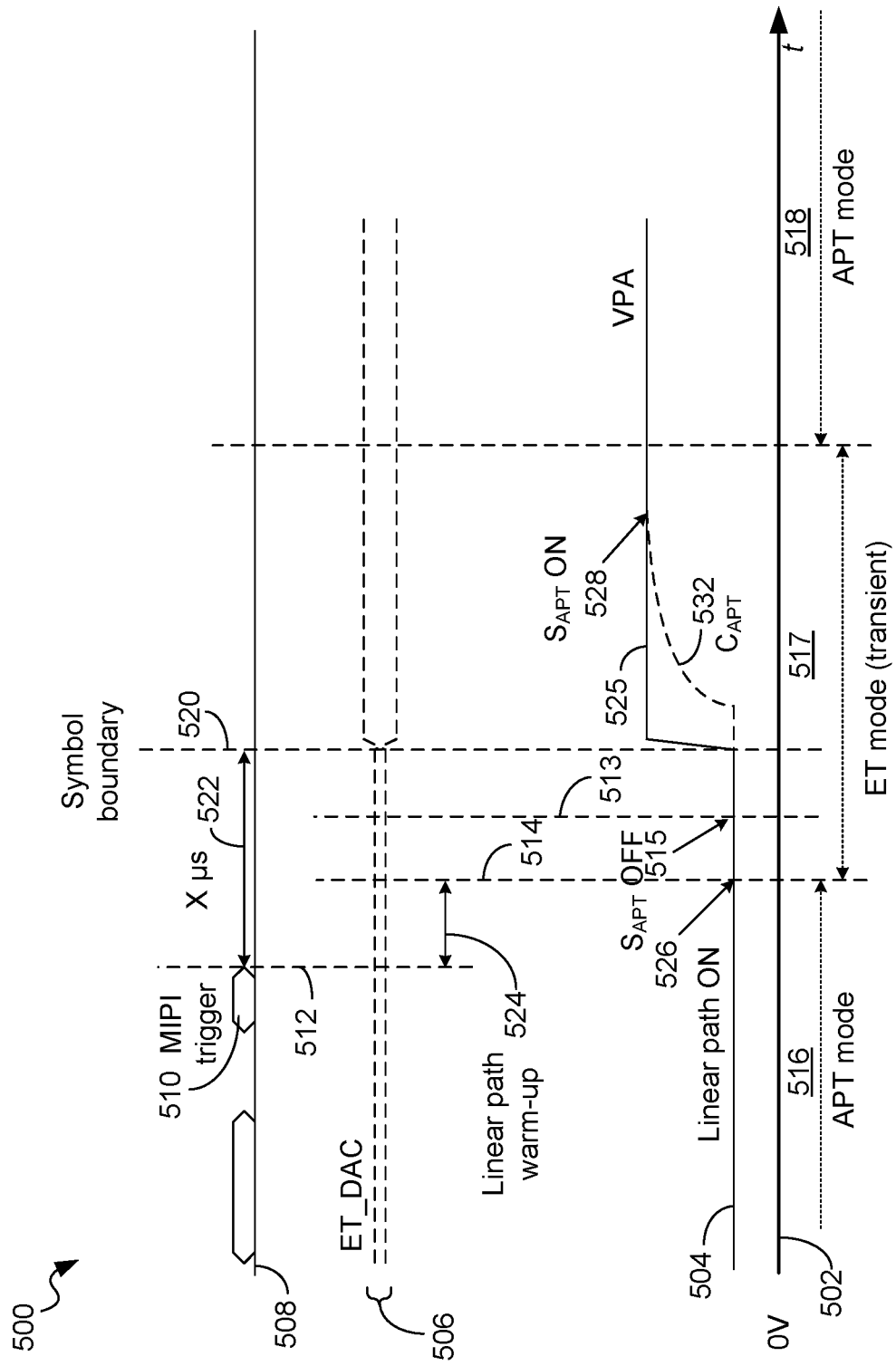
FIG. 5 is a diagram showing a timeline describing an exemplary embodiment of the operation of the envelope tracking system of FIG. 2.

FIG. 5 is a diagram 500 showing a timeline describing an exemplary embodiment of the operation of the envelope tracking system of FIG. 2. In some 5G operating modes, it may be desirable to provide a fast transition from one APT voltage to another APT voltage. For instance, it may be desirable for the voltage at node 315 of FIG. 3 or node 415 of FIG. 4 to transition from one fixed APT voltage to another fixed APT voltage in less than 1 µs. In such an operating example, it is difficult for the switching voltage regulator path (310 of FIG. 4, 410 of FIG. 4) to charge the capacitor 316 (or 416) to a second voltage that is different from the first voltage in such a short time, as the current used to achieve this voltage transition is impractically high.

In an exemplary embodiment, the timeline 500 shows a horizontal axis 502 showing time increasing to the right. An APT mode is shown during time 516, a transient ET mode is shown during time 517 and an APT mode is shown during time 518. The voltage output, VPA, of the supply modulator 246 (FIGS. 2, 3 and 4) is shown by trace 504.

The diagram 500 also shows a system timeline 508 that includes one or more mobile industry processor interface (MIPI) trigger messages, or events, an exemplary one of which is shown using reference numeral 510. The diagram 500 also shows a trace 506 representing an output of a differential envelope tracking (ET) DAC, such as the ET DAC 251 of FIG. 2. As will be described below, the trace 506 showing the output of an ET DAC is shown in dotted line because it is an example of how the data processor 210 (FIG. 2) can provide a voltage signal to the supply modulator 246 (FIG. 4). In an exemplary embodiment, the data processor 210 may communicate voltage information to the supply modulator 246 via a MIPI interface using a MIPI trigger, such as the MIPI trigger 510, in which case the ET_DAC voltage would not be used in APT modes 516 and 518 or in transient ET mode 517. For example, the voltage reference for the linear path 420 (FIG. 4) used during transient ET mode 517 could be built inside the supply modulator 246 (FIG. 4) based on voltage information sent via the MIPI interface using a MIPI trigger 510. Such an internal linear path reference will replace the ET_DAC voltage, shown by trace 506, in APT mode and ET transient mode. A similar approach of replacing the ET_DAC during APT mode and ET transient mode can be used during ET-APT or APT-ET transitions.

A communication symbol boundary 520, which also represents the RF signal symbol boundary, is shown as an example of a point at which the voltage provided by the supply modulator 246 to a power amplifier 244 may transition from one voltage level to another voltage level. This transition point may be accurately time aligned with the RF signal symbol boundary.

In an exemplary embodiment, during the APT mode 516, the switching voltage regulator (410, FIG. 4) may be providing the VPA voltage as shown by the trace 504 up to the communication symbol boundary 520. In an exemplary embodiment, when it is desired to change the voltage output provided by the switching regulator path 410 when transitioning from one voltage to another (APT>APT transition), or when transitioning from ET mode to APT mode (ET>APT), the APT capacitor (316 of FIG. 3, 416 of FIG. 4) may be disconnected from the output (315 of FIG. 3, 415 of FIG. 4) of the supply modulator 246 shown as point 515 at time 513 by opening the APT switch (314 of FIG. 3, 414 of FIG. 4). The supply modulator 246 may be switched into ET mode by enabling the linear path (320 of FIG. 3, 420 of FIG. 4) at time 514, after allowing a short time 524 for the linear path to 'warm up'. The events at the time 514 and the time 513 could happen in or out of the order shown, or at the same time. The timing of the MIPI trigger 510 may be adjusted to allow adequate warm up time for the linear path (320 of FIG. 3, 420 oF FIG. 4). In the example shown in FIG. 5, the MIPI trigger 510 occurs at time 512, which in this example, begins a warm-up period 524 during which the linear path (320 of FIG. 3, 420 of FIG. 4) warms up. As the supply modulator 246 is in ET mode, the supply modulator output (trace 504) is able to support a fast voltage transition at the communication symbol boundary 520. The supply modulator 246 may provide an adjustable timing delay of X µs (522) to ensure that the supply modulator output voltage transition occurs at the same time as the RF symbol boundary, which in this exemplary embodiment is the communication symbol boundary 520. The supply modulator 246 remains in ET mode with the linear path 320 or 420 providing the final APT voltage while the APT capacitor (316 of FIG. 3, 416 of FIG. 4) is charged to the final APT voltage by the switching regulator path 310 or 410 via the charging circuit (350 of FIG. 3, 450 of FIG. 4). Once the APT capacitor 316 (416) is charged to the final APT voltage (see trace 532) at time 528 the APT switch 314 (414) is switched back on, and then the supply modulator 246 is returned to APT operating mode with the switching regulator path 310 or 410 providing the voltage VPA at the node 315 or the node 415. In this manner, the overall APT-APT voltage transition described includes a short period of time 517 in which the supply modulator 246 is in a transient ET mode with the linear path 320 or 420 providing the voltage VPA while the switching regulator path 310 or 410 charges the APT capacitor 316 or 416 to the final APT voltage. In an exemplary embodiment, a typical duration of the transient ET mode 517 could be on the order of 10 µs to 20 µs, where most of this time period is used to charge and discharge the APT capacitor 316 or 416. The state of charge of the capacitor 316 (416) may be determined by, for example only, an analog comparator and related circuitry (not shown) that measures the voltages at the node 719 (or 819) (VPA) and at the node 729 (or 829) (VCAP), as shown below in FIG. 7 and FIG. 8. When the absolute value of the voltage difference between the nodes 719 (819) and 729 (829) becomes less than a threshold voltage, the capacitor 316 (416) is considered charged. Such an analog comparator and related circuitry would be known to those having ordinary skill in the art.

In an exemplary embodiment, the transient ET mode 517 comprises a period of time between time 526 and time 515 where the capacitor 316 (416) is coupled to the node 315 (415), a period of time between time 515 and time 528 where the capacitor 316 (416) is decoupled from the node 315 (415), and a period of time after time 528 and up to the beginning of the APT mode 518 where the capacitor 316 (416) is again coupled to the node 315 (415). The period of time where the capacitor 316 (416) is decoupled from the node 315 (415), i.e., between time 515 and time 528, may be considered normal ET mode operation. In this manner, a transition from ET mode to APT mode is illustrated as occurring from the time where the capacitor 316 (416) is decoupled from the node 315 (415) (between time 515 and time 528) to the time 528 where the capacitor 316 (416) is again coupled to the node 315 (415) and up to the beginning of the APT mode 518 where the capacitor 316 (416) is coupled to the node 315 (415) and the switching regulator path 310 (410) is providing the APT voltage.

Figure 6:
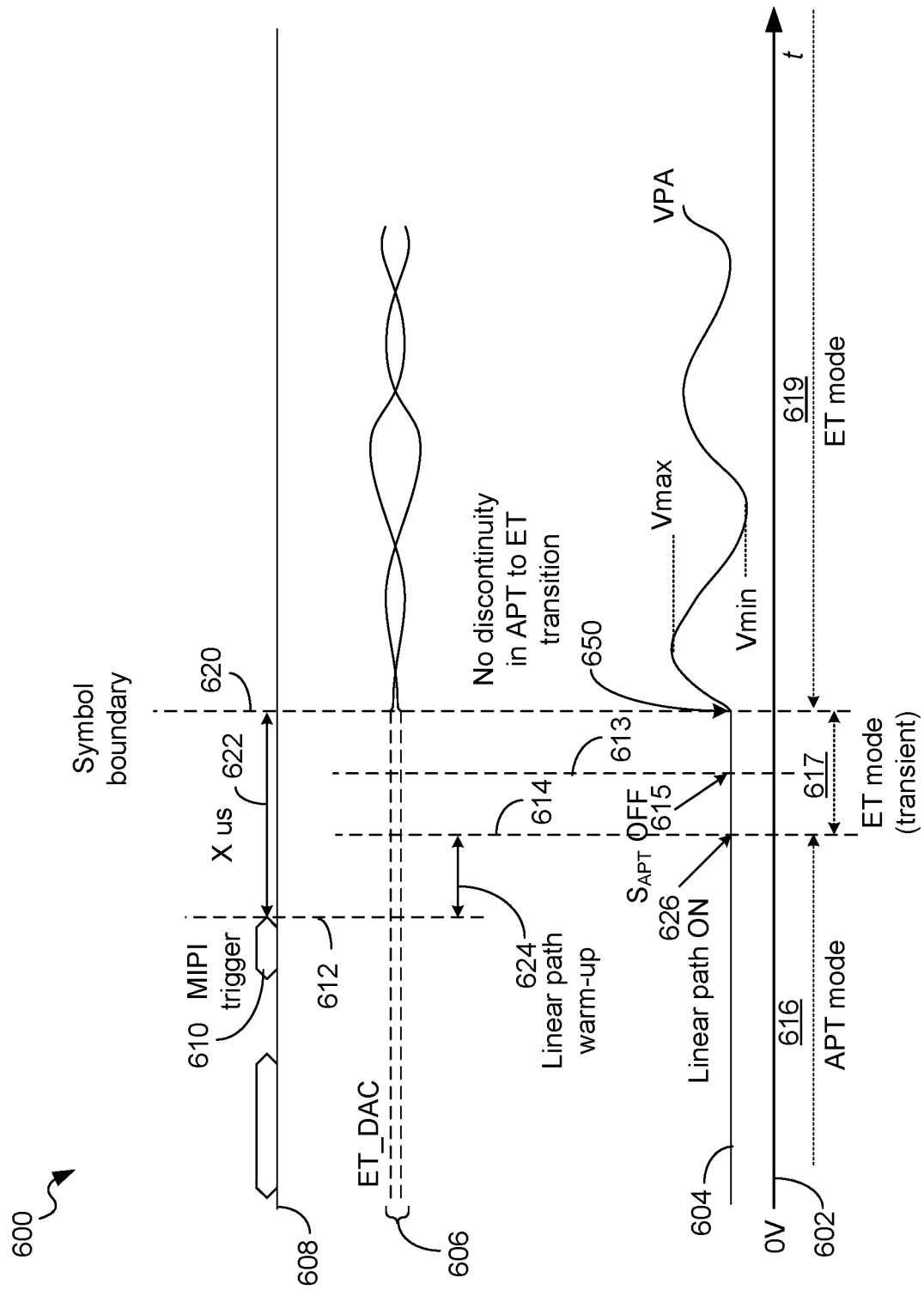
FIG. 6 is a diagram showing a timeline describing an exemplary embodiment of the operation of the envelope tracking system of FIG. 2.

FIG. 6 is a diagram 600 showing a timeline describing an exemplary embodiment of the operation of the envelope tracking system of FIG. 2 when making an APT to ET transition. In an exemplary embodiment, the timeline 600 shows a horizontal axis 602 showing time increasing to the right. An APT mode is shown during time 616, a transient ET mode, in which a fixed APT voltage is provided by the linear path 320 or 420, is shown during time 617 and an ongoing ET mode, in which the (e.g., rapidly) varying ET voltage is provided by the linear path 320 or 420, is shown during time 619. The voltage output, VPA, of the supply modulator 246 (FIGS. 2, 3 and 4) is shown by trace 604.

The diagram 600 also shows a system timeline 608 that includes one or more MIPI trigger messages, an exemplary one of which is shown using reference numeral 610. The diagram 600 also shows a trace 606 representing an output of an envelope tracking (ET) DAC, such as the ET DAC 251 of FIG. 2. As mentioned above, the trace 606 showing the output of an ET DAC is shown in dotted line up until the time of a communication symbol boundary 620 because it is one example of how the data processor 210 (FIG. 2) can provide a voltage signal to the supply modulator 246 (FIG. 4). In another exemplary embodiment, the data processor 210 may communicate voltage information to the supply modulator 246 using a signal embedded in a MIPI trigger, such as the MIPI trigger 610, in which case the trace 606 would be omitted during the APT mode 616 and the ET mode 617.

The communication symbol boundary 620 is shown as an example of a point at which the symbol power level changes. It may be observed that there is little or no discontinuity in the output voltage of the supply modulator 246 at the communication symbol boundary 620, hence there is little risk of RF signal corruption.

In an exemplary embodiment, during the APT mode 616, the switching regulator path (310, FIG. 3 or 410, FIG. 4) may be providing a voltage as shown by the trace 604. In an exemplary embodiment, when it is desired to change the voltage provided by the switching regulator path 410 to a voltage provided by the linear path 420, for example, when transitioning from APT mode to ET mode (APT>ET), the supply modulator 246 (FIG. 3 and FIG. 4) may be configured to enable the linear path 320 (420) prior to the communication symbol boundary 620 to help provide the voltage, VPA, to the node 315 (415) at point 650. As mentioned above, the linear path 320 (420) may be activated by the MIPI trigger 610 occurring at a time 614, such that the linear path 320 (420) has sufficient time to warm up (shown at time 624), so that the linear path 320 (420) is fully ON at time 626 and may be able to provide the voltage, VPA, during the ET transition time 617, resulting in no discontinuity in the voltage output VPA at the node 315 (415) beginning at time 650. The APT switch 414 (FIG. 4) or 314 (FIG. 3) opens at point 615 at time 613 disconnecting the APT capacitor 416 (FIG. 4) or 316 (FIG. 3) from the output node 315 or 415 so that beginning at time 613, before the communication symbol boundary 620, the linear path 320 or 420 provides the voltage, VPA to the node 315 (415). In this exemplary embodiment, after the communication symbol boundary 620, the linear path 320 or 420 continues to provide the voltage, VPA, during the time 619 in ET mode.

Figure 7:
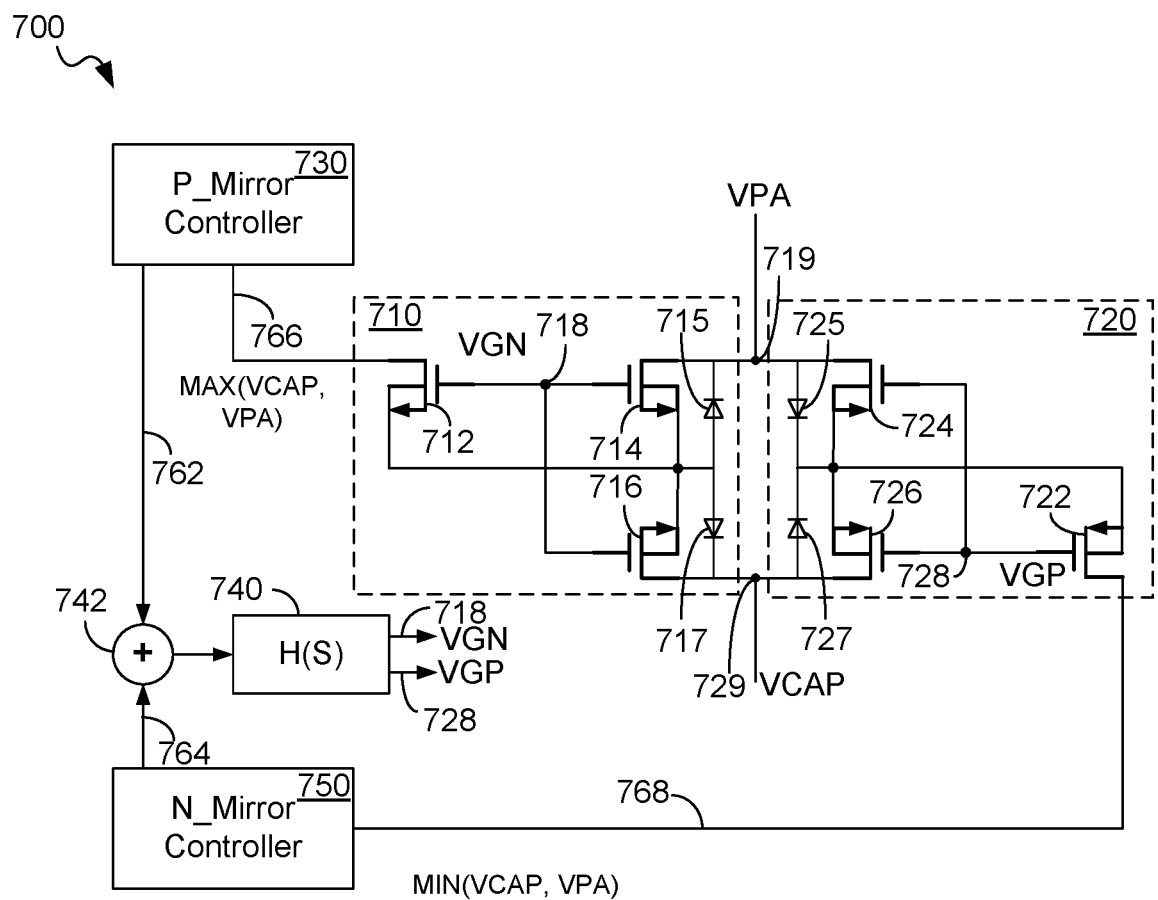
FIG. 7 is a schematic diagram showing an exemplary embodiment of the charging circuits of FIG. 3 and FIG. 4.

FIG. 7 is a schematic diagram 700 showing an exemplary embodiment of the charging circuit 350 of FIG. 3 and 450 of FIG. 4. In an exemplary embodiment, the charging circuit 700 comprises N-type circuitry 710 and P-type circuitry 720.

In an exemplary embodiment, the N-type circuitry 710 comprises NMOS transistors 712, 714 and 716. A diode 715 represents the body diode of the transistor 714 and a diode 717 represents a body diode of the transistor 716. The gates of the transistors 712, 714 and 716 are coupled to a node 718.

In an exemplary embodiment, the P-type circuitry 720 comprises PMOS transistors 722, 724 and 726. A diode 725 represents the body diode of the transistor 724 and a diode 727 represents a body diode of the transistor 726. The gates of the transistors 722, 724 and 726 are coupled to a node 728.

The drains of the transistors 714 and 724 are coupled to a node 719, which may comprise the voltage output VPA provided to a power amplifier 244 (FIG. 2).

The drains of the transistors 716 and 726 are coupled to a node 729, which may comprise the voltage output, VCAP, provided to the capacitor 416 ($C_{APT}$).

If the voltage at the node 719 is higher than the voltage at the node 729, current will flow through two paths toward the node 729. In this example, current will flow through a first path comprising the transistor 714 and the diode 717 and current will flow through a second path comprising the diode 725 and the transistor 726. When the voltage VGN on connection 718 is sufficiently high relative to the voltage VCAP at node 729, the transistor 716 will turn on and will conduct some or all of the current from the diode 717. A similar situation will occur for the transistor 724 and the diode 725. When the voltage VGP at connection 728 is sufficiently low relative to the voltage VPA at node 719, transistor 724 will turn on and will conduct some or all of the current from diode 725. If the voltage at the node 729 is higher than the voltage at the node 719, current will flow through two paths as well. In this example, current will flow toward the node 719 through a first path comprising the transistor 716 and the diode 715 and current will flow through a second path comprising the diode 727 and the transistor 724. Similar to the situation above, the transistors 714 and 726 can turn on and may conduct some or all of the current from the diodes 715 and 727 respectively. Given the symmetry between the diodes 715 and 717 and the symmetry between the diodes 725 and 727, the N-type circuitry 710 and the P-type circuitry 720 forms a bidirectional switch. The conduction ratio between the N-type circuitry 710 and the P-type circuitry 720 will depend on the voltage range for VCAP and VPA. The N-type circuitry 710 will conduct more for low voltage ranges where P-type circuitry may run out of voltage headroom for the voltage VGP at connection 728 and the P-type circuitry 720 will conduct more for high voltage ranges where N-type circuitry may run out of voltage headroom for the voltage VGN at connection 718.

The current flowing through the N-type circuitry 710 comprising transistor 716, transistor 714, diode 717 and diode 715 will be mirrored through the transistor 712 and a replica current will flow through the connection 766. Similarly, the current flowing through the P-type circuitry 720 comprising transistor 726, transistor 724, diode 727 and diode 725 will be mirrored through the transistor 722 and a replica current will flow through the connection 768.

An output of the P_mirror controller 730 may be provided over connection 762 to a summing node 742 and an output of the N_mirror controller 750 may be provided over connection 764 to the summing node 742. The P_mirror controller 730 and the N_mirror controller 750 provide signals that may be used to maintain the bidirectional current limiting function of the N-type circuitry 710 and P-type circuitry 720. In an exemplary embodiment, the P_mirror controller 730 and the N_mirror controller 750 may control the current flow to the APT capacitor 316 (416) while it is charged/discharged to the final APT voltage (e.g., trace 532 of FIG. 5). The P_mirror controller 730 and the N_mirror controller 750 need not be implemented together with the circuitry used to implement the N-type circuitry 710 and P-type circuitry 720; one or both of the P_mirror controller 730 and the N_mirror controller 750 but may be implemented in the same IC or proximate the N-type circuitry 710 and P-type circuitry 720, or one or both of the P_mirror controller 730 and the N_mirror controller 750 may be implemented in one or more controllers (e.g., in the data processor 210) remote from the N-type circuitry 710 and/or P-type circuitry 720. The summing node 742 sums the current on connections 762 and 764 and provides an input to a bias function (H(S)) 740

The bias function, H(S) 740, provides a gate voltage (VGN) to the node 718 and provides a gate voltage, VGP to the node 728. The bias function H(S) 740 achieves the current limiting function of the total current flowing through the P-type circuitry 710 and the N-type circuitry 720 between the node 719 (VPA) and the node 729 (VCAP) by controlling VGN on connection 718 and VGP on connection 728 such that the total current flowing between the node 719 and the node 729 is constant.

Figure 8:
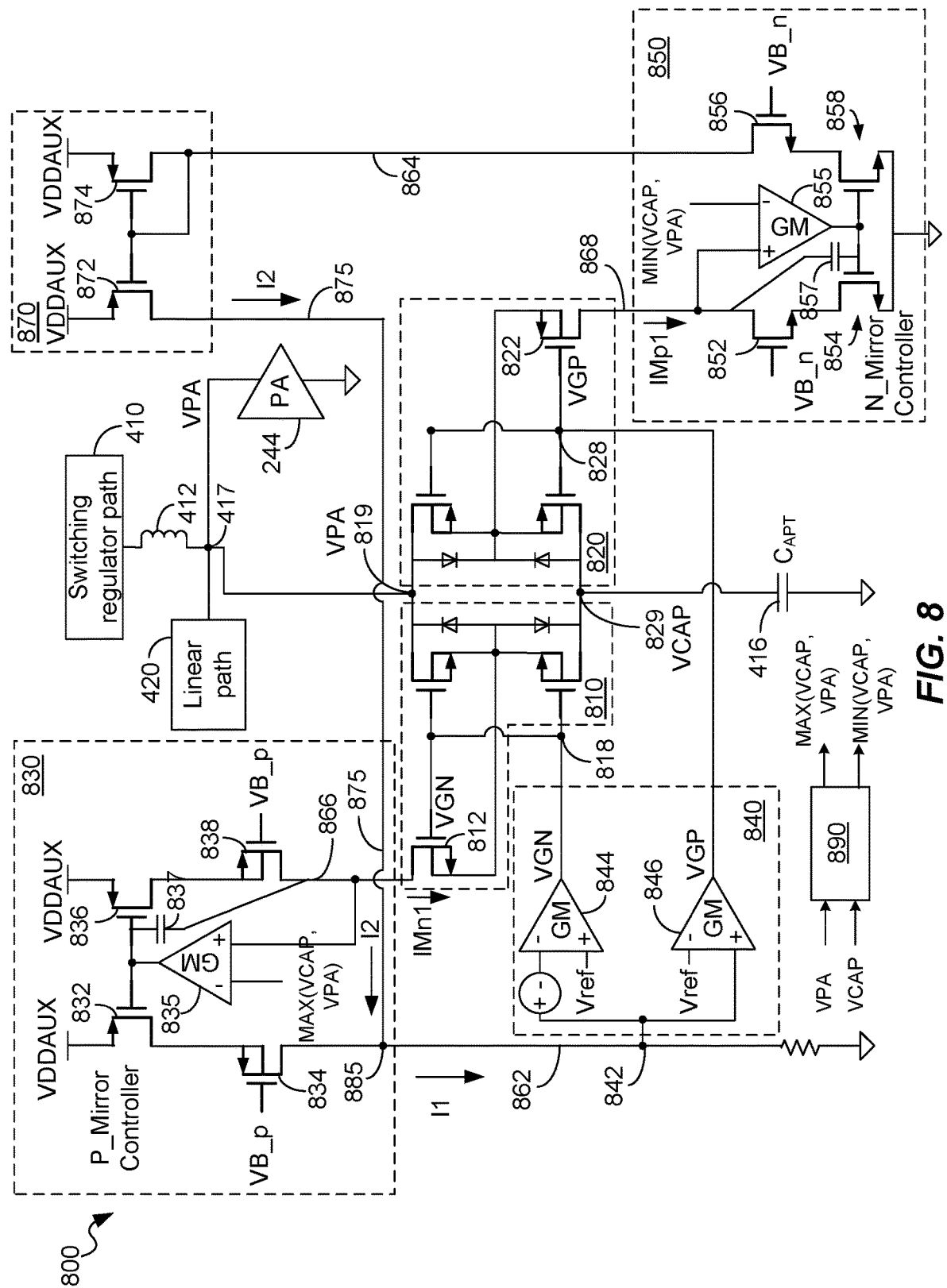
FIG. 8 is a schematic diagram showing an exemplary embodiment of the charging circuit of FIG. 7.

FIG. 8 is a schematic diagram 800 showing an exemplary embodiment of the charging circuit 700 of FIG. 7, along with the switching regulator path 410 (FIG. 4), linear path 420 (FIG. 4), inductor 412, and power amplifier 244 (FIG. 4). The switching regulator path 410 (FIG. 4), linear path 420 (FIG. 4), inductor 412, and power amplifier 244 (FIG. 4) are shown for reference in addition to the elements in FIG. 8 of the embodiment of the charging circuit 700 of FIG. 7.

Elements in FIG. 8 that are similar to corresponding elements in FIG. 7 will be labeled using the nomenclature 8XX, where an element in FIG. 8 labeled 8XX is similar to an element in FIG. 7 labeled 7XX. For example, the N-type circuitry 710 in FIG. 7 is similar to, and is an exemplary embodiment of the N-type circuitry 810 in FIG. 8. Further, some of the reference numerals for elements in FIG. 8 that are similar to elements in FIG. 7 are omitted for drawing clarity. For example, the reference numerals for at least some of the transistors and diodes in the N-type circuitry 810 and P-type circuitry 820 in FIG. 8 may be omitted for drawing clarity. FIG. 8 generally shows an embodiment of the P_mirror controller 730 and N_mirror controller 750 of FIG. 7 in greater detail.

In an exemplary embodiment, the circuit 800 comprises a current mirror 870 that mirrors the current through the connection 864 into the current I2 on connection 875. In an exemplary embodiment, the current mirror 870 comprises transistors 872 and 874 having their sources coupled to an auxiliary voltage, VDDAUX. The drain of the transistor 872 is coupled to a connection 875 and a current, I2, flows toward the node 885. The drain of the transistor 874 is coupled to the drain of a transistor 856 in the N_mirror controller 850 over connection 864.

The N_mirror controller 850 comprises transistors 852, 854, 856 and 858, an amplifier (GM stage) 855 and a capacitor 857. The drain of the transistor 852 is coupled to the drain of the transistor 822 in the P-type circuitry 820 over connection 868. A current, IMp1 flows toward the transistor 852 in the connection 868. The gates of the transistors 852 and 856 receive a bias signal VN_n. The gates of the transistors 854 and 858 are coupled to the output of the amplifier 855. A minimum and maximum voltage selector 890 between the node 829 (VCAP) and the node 819 (VPA) provides a voltage MIN(VCAP, VPA) to the inverting input of the amplifier 855. A voltage selector function may have the voltages VPA and VCAP as inputs and the voltages MIN(VCAP, VPA) and MAX(VCAP, VPA) as outputs. The voltage MIN(VCAP, VPA) is the minimum voltage between VCAP and VPA and the voltage MAX (VCAP, VPA) is the maximum voltage between VCAP and VPA.

The circuit 800 also comprises a P_Mirror controller 830 having transistors 832, 834, 836 and 838, an amplifier (GM stage) 835 and a capacitor 837. The drain of the transistor 838 is coupled to the drain of the transistor 812 in the N-type circuitry 810 over connection 866. A current, IMn1 flows toward the transistor 812 in the connection 866. The gates of the transistors 834 and 838 receive a bias signal VN_p. The gates of the transistors 832 and 836 are coupled to the output of the amplifier 835. The minimum and maximum voltage selector 890 provides the voltage MAX(VCAP, VPA) to the inverting input of the amplifier 835.

A current, I1, flows from the drain of the transistor 834 toward the node 842 in the connection 862. The node 842 sums the current I1 and the current I2, and provides this summed current to the inverting input of an amplifier 844 and to the non-inverting input of an amplifier 846.

In an exemplary embodiment, the non-inverting input of the amplifier 844 is coupled to the inverting input of the amplifier 846. The amplifier 844 provides the bias signal, VGN to the node 818 and the amplifier 846 provides the bias signal, VGP, to the node 828. The amplifier 844 and the amplifier 846 regulate the summation of the current I1 and the current I2 by maintaining the voltage at connection 842 constant. The current I1 is a replica of the current flowing through the N-type circuitry 810 and the current I2 is a replica of the current flowing through the P-type circuitry 820. By maintaining the summation of the currents (I1+I2) constant, the overall loop maintains the total current between the node 819 (VPA) and the node 829 (VCAP) constant therefore achieving bidirectional current limit.

Figure 9:
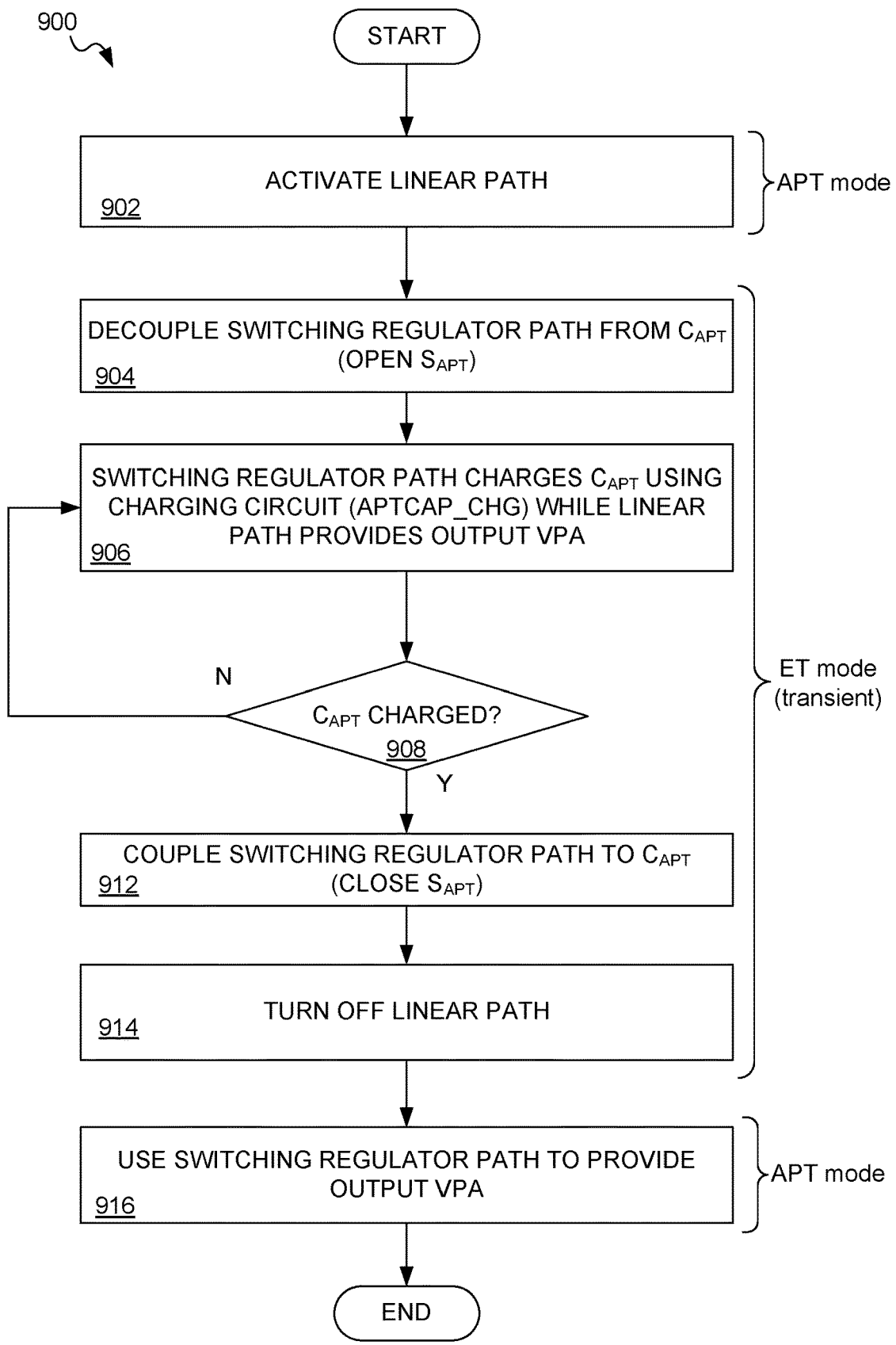
FIG. 9 is a flow chart describing the operation of an exemplary embodiment of an envelope tracking system in accordance with an exemplary embodiment of the disclosure.

FIG. 9 is a flow chart 900 describing the operation of an exemplary embodiment of an envelope tracking system in accordance with an exemplary embodiment of the disclosure. The blocks in the method 900 can be performed in or out of the order shown, and in some embodiments, can be performed at least in part in parallel. In an exemplary embodiment, the method 900 will make reference to some or all of the elements in the envelope tracking system 243 and the supply modulator 246 of FIG. 2, the supply modulator 246 of FIG. 4, and the timeline 500 of FIG. 5. However, the method 900 applies to all exemplary embodiments of the envelope tracking system, envelope signal generator, and the supply modulator described herein.

In block 902, and optionally in parallel with the operation of block 904, the linear path 420 is activated and is configured to provide a voltage output, VPA_FB, to the power amplifier 244 (FIG. 4). This corresponds to the time 514 in FIG. 5. In an exemplary embodiment, the linear path 420 may receive a signal, for example, from a MIPI trigger 510 (FIG. 5) to begin warm-up prior to the linear path 420 being turned on and active in block 902.

In block 904, the switch 414 ($S_{APT}$, FIG. 4) may be opened. Opening the switch 414 decouples the switching regulator path 410 from the capacitor 416 ($C_{APT}$, FIG. 4). This may correspond to the time 513 in FIG. 5.

In block 906, while the linear path 420 is providing a voltage signal, VPA_FB, for the power amplifier 244 (portion 525 of the VPA trace 504 in FIG. 5), the switching regulator path 410 provides a voltage to charge the capacitor 416 ($C_{APT}$), via the charging circuit 450 (portion 532 of the VPA trace 504 in FIG. 5). For example, the linear path 420 and the switching regulator path 410 cooperate to provide the voltage signal, VPA to the power amplifier 244 while also charging the capacitor 416 ($C_{APT}$), via the charging circuit 450.

In block 908 it is determined whether the capacitor 416 ($C_{APT}$) is charged to the desired voltage. If it is determined in block 908 that the capacitor 416 ($C_{APT}$) is not charged to the desired voltage, then the process returns to block 906, and the switching regulator path 410 continues to charge the capacitor 416 ($C_{APT}$), via the charging circuit 450. If it is determined in block 908 that the capacitor 416 ($C_{APT}$) is charged to the desired voltage, then the process proceeds to block 912.

In block 912, the switch 414 ($S_{APT}$) is closed. This corresponds to the time point 528 in FIG. 5. Closing the switch 414 couples the switching regulator path 410 to the capacitor 416 ($C_{APT}$, FIG. 4).

In block 914, the linear path 420 is turned off. This may correspond to a time point between the time point 528 and the beginning of the APT mode 518 in FIG. 5.

In block 916, the switching regulator path 410 provides the voltage, VPA. This corresponds to the APT mode 518 in FIG. 5.

Figure 10:
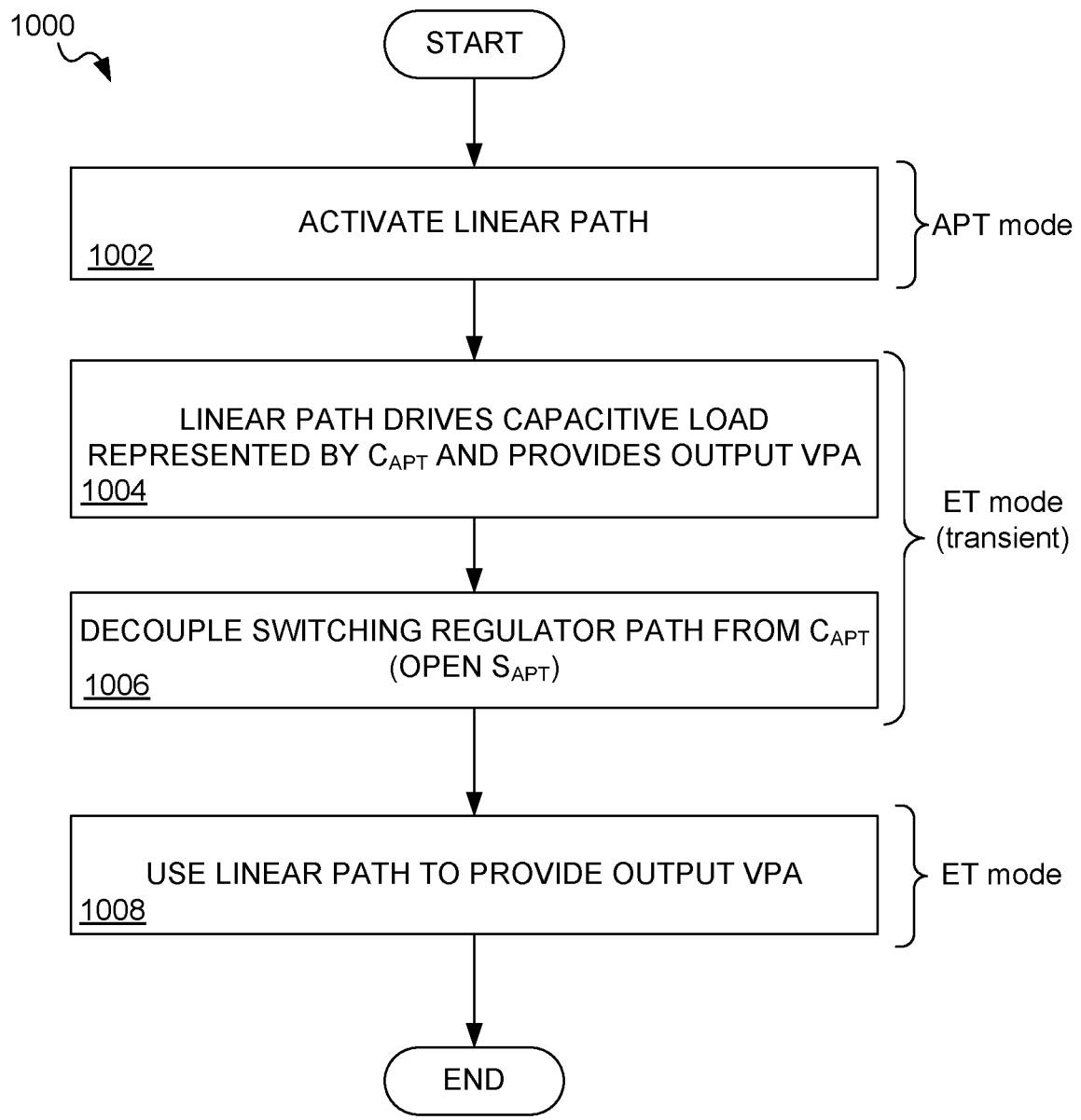
FIG. 10 is a flow chart describing the operation of an exemplary embodiment of an envelope tracking system in accordance with an exemplary embodiment of the disclosure.

FIG. 10 is a flow chart 1000 describing the operation of an exemplary embodiment of an envelope tracking system in accordance with an exemplary embodiment of the disclosure. The blocks in the method 1000 can be performed in or out of the order shown, and in some embodiments, can be performed at least in part in parallel. In an exemplary embodiment, the method 1000 will make reference to some or all of the elements in the envelope tracking system 243 and the supply modulator 246 of FIG. 2, the supply modulator 246 of FIG. 4, and the timeline 600 of FIG. 6. However, the method 1000 applies to all exemplary embodiments of the envelope tracking system, envelope signal generator, and the supply modulator described herein.

In block 1002, and optionally in parallel with the operation of block 1004, the linear path 420 is activated and is configured to provide a voltage output, VPA to the power amplifier 244 (FIG. 4). In this exemplary embodiment, the ET_DAC, shown using trace 606, references the output voltage, VPA, while the system is in APT mode. The linear path being on corresponds to the time 614 in FIG. 6. In an exemplary embodiment, the linear path 420 may receive a signal, for example, from a MIPI trigger 610 (FIG. 6) to begin warm-up prior to the linear path 420 being turned on in block 1002.

In block 1004, the linear path 420 drives the capacitive load represented by the capacitor 416 ($C_{APT}$, FIG. 4), and provides the output VPA. This may correspond to the time 614 in FIG. 6.

In block 1006, the switch 414 ($S_{APT}$, FIG. 4) may be opened. Opening the switch 414 decouples the switching regulator path 410 from the capacitor 416 ($C_{APT}$, FIG. 4). This may correspond to the time 613 in FIG. 6.

In block 1008, the linear path 420 provides the voltage, VPA. This corresponds to the ET mode 619 in FIG. 6.

Figure 11:
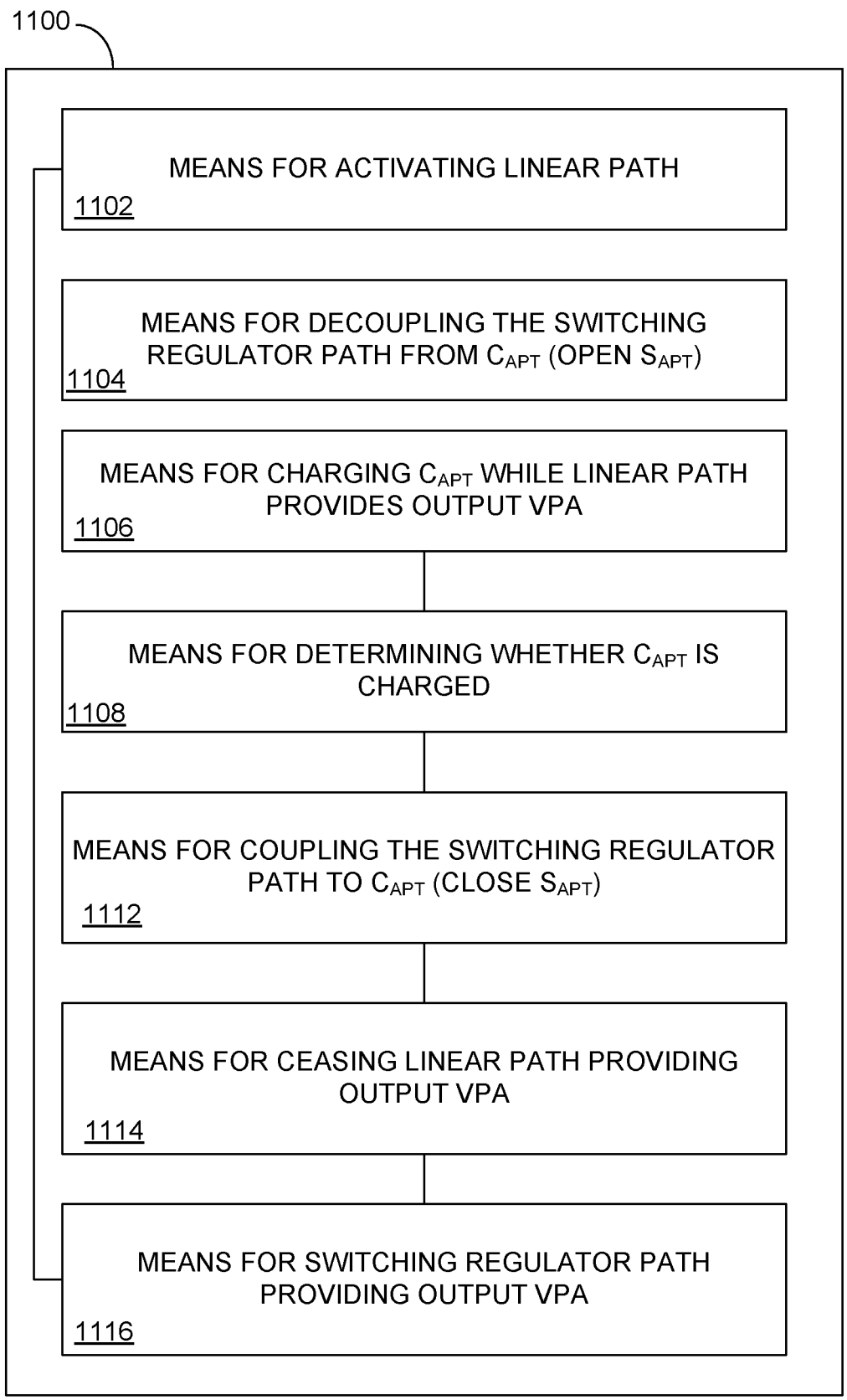
FIG. 11 is a functional block diagram of an apparatus for an envelope tracking system in accordance with an exemplary embodiment of the disclosure.

FIG. 11 is a functional block diagram of an apparatus 1100 for an envelope tracking system in accordance with an exemplary embodiment of the disclosure. The apparatus 1100 comprises means 1102 for activating the linear path of an envelope tracking system. In certain embodiments, the means 1102 for activating the linear path of an envelope tracking system can be configured to perform one or more of the functions described in operation block 902 of method 900 (FIG. 9). In an exemplary embodiment, the means 1102 for activating the linear path of an envelope tracking system may comprise the envelope signal generator 245, for example configured to turn on the linear path 420 (or any alternative embodiment of the linear path 420) to provide an output (VPA) to the power amplifier 244.

The apparatus 1100 also comprises means 1104 for decoupling the switching regulator path 410 from the capacitor 416. In certain embodiments, the means 1104 for decoupling the switching regulator path 410 from the capacitor 416 can be configured to perform one or more of the functions described in operation block 904 of method 900 (FIG. 9). In an exemplary embodiment, the means 1104 for decoupling the switching regulator path 410 from the capacitor 416 may comprise the envelope signal generator 245, for example configured to cause the switch 414 ($S_{APT}$) (or any alternative embodiment of the switch 414) to open.

The apparatus 1100 also comprises means 1106 for charging, $C_{APT}$ while the linear path provides a voltage output. In certain embodiments, the means 1106 for charging, $C_{APT}$ while the linear path provides a voltage output can be configured to perform one or more of the functions described in operation block 906 of method 900 (FIG. 9). In an exemplary embodiment, the means 1106 for charging, $C_{APT}$ while the linear path provides a voltage output may comprise the switching regulator path 410, for example configured to charge the capacitor 416 ($C_{APT}$), via the charging circuit 450, while the linear path 42 provides a voltage signal, VPA, to the power amplifier 244.

The apparatus 1100 also comprises means 1108 for determining whether $C_{APT}$ is charged. In certain embodiments, the means 1108 for determining whether $C_{APT}$ is charged can be configured to perform one or more of the functions described in operation block 908 of method 900 (FIG. 9). In an exemplary embodiment, the means 1108 for determining whether $C_{APT}$ is charged may comprise a comparator and related circuitry (not shown), for example configured to measure the voltages at the node 719 (FIG. 7) (or 819, FIG. 8) (VPA) and at the node 729 (FIG. 7) (or 829, FIG. 8) VCAP to determine whether the absolute value of the voltage difference between the nodes 719 (819) and 729

(829) becomes less than a threshold voltage, and thereby determine that the capacitor 416 is charged to the desired voltage.

The apparatus 1100 also comprises means 1112 for coupling the switching regulator path 410 to the capacitor 416 ($C_{APT}$, FIG. 4). In certain embodiments, the means 1112 for coupling the switching regulator path 410 to the capacitor 416 ($C_{APT}$, FIG. 4) can be configured to perform one or more of the functions described in operation block 912 of method 900 (FIG. 9). In an exemplary embodiment, the means 1112 for coupling the switching regulator path 410 to the capacitor 416 ($C_{APT}$, FIG. 4) may comprise the envelope signal generator 245, for example configured to cause the switch 414 ($S_{APT}$) (or any alternative embodiment of the switch 414) to close.

The apparatus 1100 also comprises means 1114 for ceasing the linear path providing an output VPA. In certain embodiments, the means 1114 for ceasing the linear path providing an output VPA can be configured to perform one or more of the functions described in operation block 914 of method 900 (FIG. 9). In an exemplary embodiment, the means 1114 for ceasing the linear path providing an output VPA may comprise the envelope signal generator 245, for example configured to turn off the linear path 420.

The apparatus 1100 also comprises means 1116 for the switching regulator path to provide a voltage output VPA. In certain embodiments, the means 1116 for the switching regulator path to provide a voltage output VPA can be configured to perform one or more of the functions described in operation block 916 of method 900 (FIG. 9). In an exemplary embodiment, the means 1116 for the switching regulator path to provide a voltage output VPA may comprise the envelope signal generator 245, for example configured to turn on the switching regulator path 410 so that the switching regulator path 410 provides the voltage output VPA.

Figure 12:
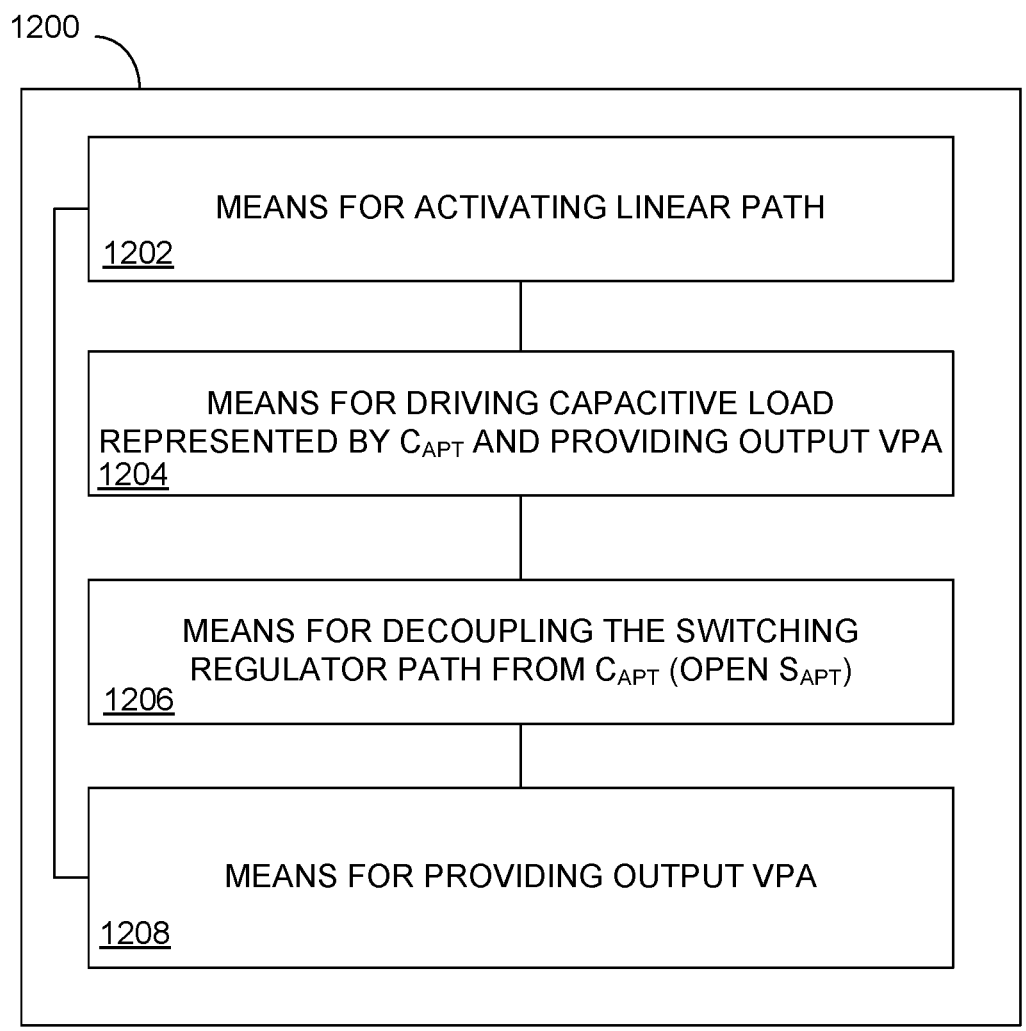
FIG. 12 is a functional block diagram of an apparatus for an envelope tracking system in accordance with an exemplary embodiment of the disclosure.

FIG. 12 is a functional block diagram of an apparatus 1200 for an envelope tracking system in accordance with an exemplary embodiment of the disclosure. The apparatus 1200 comprises means 1202 for activating the linear path of an envelope tracking system. In certain embodiments, the means 1202 for activating the linear path of an envelope tracking system can be configured to perform one or more of the functions described in operation block 1002 of method 1000 (FIG. 10). In an exemplary embodiment, the means 1202 for activating the linear path of an envelope tracking system may comprise the envelope signal generator 245, for example configured to turn on the linear path 420 (or any alternative embodiment of the linear path 420) to provide an output (VPA) to the power amplifier 244.

The apparatus 1200 also comprises means 1204 for driving the capacitive load represented by the capacitor 416 ($C_{APT}$, FIG. 4), and providing the output VPA. In certain embodiments, the means 1204 for driving the capacitive load represented by the capacitor 416 ($C_{APT}$, FIG. 4), and providing the output VPA can be configured to perform one or more of the functions described in operation block 1004 of method 1000 (FIG. 10). In an exemplary embodiment, the means 1204 for driving the capacitive load represented by the capacitor 416 ($C_{APT}$, FIG. 4), and providing the output VPA may comprise the linear path 420, for example configured to drive the capacitive load represented by the capacitor 416 ($C_{APT}$, FIG. 4), and provide the output VPA.

The apparatus 1200 also comprises means 1206 for decoupling the switching regulator path 410 from the capacitor 416 ($C_{APT}$, FIG. 4). In certain embodiments, the means 1206 for decoupling the switching regulator path 410 from the capacitor 416 ($C_{APT}$, FIG. 4) can be configured to perform one or more of the functions described in operation block 1006 of method 1000 (FIG. 10). In an exemplary embodiment, the means 1206 for decoupling the switching regulator path 410 from the capacitor 416 ($C_{APT}$, FIG. 4) may comprise the envelope signal generator 245, for example configured to cause the switch 414 ($S_{APT}$) (or any alternative embodiment of the switch 414) to open.

The apparatus 1200 also comprises means 1208 for providing the output VPA. In certain embodiments, the means 1208 for providing the output VPA can be configured to perform one or more of the functions described in operation block 1008 of method 1000 (FIG. 10). In an exemplary embodiment, the means 1208 for providing the output VPA may comprise the linear path 420, for example configured to provide the output VPA.

The envelope tracking system described herein may be implemented on one or more ICs, analog ICs, RFICs, mixed-signal ICs, ASICs, printed circuit boards (PCBs), electronic devices, etc. The envelope tracking system described herein may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the envelope tracking system described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC, (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Other such non-transitory computer-readable media may also be implemented. Further, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although selected aspects have been illustrated and described in detail, it will be understood that various substitutions and alterations may be made therein without departing from the spirit and scope of the present invention, as defined by the following claims.

What is claimed is:

1. An envelope tracking system, comprising:
   an envelope signal generator;
   a supply modulator coupled to the envelope signal generator, the supply modulator comprising a switching regulator path configured to provide an output voltage at an output node to a power amplifier when in an average power tracking (APT) mode, the switching regulator path configured to operate together with a linear path to provide the output voltage at the output node to the power amplifier when in an envelope tracking (ET) mode;
   a capacitor having a first and second terminal, the first terminal coupled to ground;
   a switch coupled between the output node and the second terminal of the capacitor, the switch being configured to selectively disconnect the capacitor from the output node; and
   a circuit coupled between the output node and the second terminal of the capacitor, the circuit comprising a bi-directional current-limiting switch, the circuit configured to charge or discharge the capacitor in a way that a voltage across the capacitor changes from a first voltage to a second voltage.

2. The envelope tracking system of claim 1, wherein the circuit further comprises N-type transistors and P-type transistors configured to allow bi-directional current flow.

3. The envelope tracking system of claim 1, wherein the linear path is configured to be activated by a mobile industry processor interface (MIPI) trigger prior to a time at which the linear path provides the output voltage to the power amplifier.

4. The envelope tracking system of claim 1, wherein the bi-directional current-limiting switch is configured to charge or discharge the capacitor based on a maximum and minimum current.

5. The envelope tracking system of claim 4, wherein the bi-directional current-limiting switch is configured to charge or discharge the capacitor based on N-type transistors and P-type transistors in respective N-type control circuitry and P-type control circuitry.

6. The envelope tracking system of claim 5, wherein the N-type control circuitry and P-type control circuitry further comprise amplification stages.

7. The envelope tracking system of claim 5, wherein an output of the N-type control circuitry is combined with an output of the P-type control circuitry and provided to a bias function configured to provide a current limiting function to the bi-directional current-limiting switch.

8. A method for communication, comprising:
   providing a first voltage to a power amplifier using a switching regulator path; and
   when switching from the first voltage to a second voltage in a first mode, or when switching from the first mode to a second mode, using a linear path to provide the first voltage to the power amplifier while the switching regulator path is decoupled from an output node of an output capacitor while the output capacitor is charged to the second voltage through a circuit comprising a bi-directional switch.

9. The method of claim 8, wherein the first mode comprises an average power tracking (APT) mode and the second mode comprises an envelope tracking (ET) mode.

10. The method of claim 8, further comprising activating the linear path using a mobile industry processor interface (MIPI) trigger prior to a time at which the linear path provides the first voltage.

11. The method of claim 8, further comprising providing a discontinuity free transition when switching from the first mode to the second mode.

12. The method of claim 8, wherein the bi-directional switch provides a current-limiting function.

13. The method of claim 8, further comprising charging or discharging the output capacitor based on a maximum and minimum current.

14. The method of claim 13, further comprising determining the maximum and minimum current using N-type transistors and P-type transistors in respective N-type control circuitry and P-type control circuitry.

15. The method of claim 14, wherein the N-type control circuitry and P-type control circuitry further comprise amplification stages.

16. The method of claim 14, further comprising combining an output of the N-type control circuitry with an output of the P-type control circuitry to develop a bias signal configured to provide a current limiting function to the bi-directional switch.

17. An envelope tracking system, comprising:
   an envelope signal generator;
   a supply modulator coupled to the envelope signal generator, the supply modulator comprising a switching regulator path configured to provide an output voltage to a power amplifier when in an average power tracking (APT) mode, the switching regulator path configured to operate together with a linear path to provide the output voltage to the power amplifier when in an envelope tracking (ET) mode;
   circuitry configured to activate elements associated with the ET mode prior to a symbol boundary based at least in part on a mobile industry processor interface (MIPI) trigger; and
   a switch configured to disconnect an output node of an output capacitor that is charged to a first output voltage from the supply modulator while the output voltage is provided to the power amplifier in the ET mode.

18. The envelope tracking system of claim 17, wherein the supply modulator provides a discontinuity-free voltage output transition from APT mode to ET mode.

19. A method for communication, comprising:
   providing a first voltage in a first mode to a power amplifier using a linear path;
   when switching from the first voltage to a second voltage in a second mode, using the linear path to provide the second voltage to the power amplifier while a switching regulator path is decoupled from an output node of an output capacitor and the switching regulator path charges the output capacitor to the second voltage; and
   when the output capacitor is charged to the second voltage, deactivating the linear path and coupling the switching regulator path to the output node of the output capacitor in a way that the switching regulator path provides the second voltage in the second mode while the output capacitor is charged to the second voltage through a charging circuit comprising a bi-directional switch.

20. The method of claim 19, wherein the first mode comprises an envelope tracking (ET) mode and the second mode comprises an average power tracking (APT) mode.

21. The method of claim 19, wherein the bi-directional switch provides a current-limiting function.

22. The method of claim 19, further comprising activating the linear path using a mobile industry processor interface (MIPI) trigger prior to a time at which the linear path provides the first voltage.

23. The method of claim 19, further comprising charging or discharging the output capacitor based on a maximum and minimum current.

24. The method of claim 23, further comprising determining the maximum and minimum current using N-type transistors and P-type transistors in respective N-type control circuitry and P-type control circuitry.

25. The method of claim 24, wherein the N-type control circuitry and P-type control circuitry further comprise amplification stages.

26. The method of claim 24, further comprising combining an output of the N-type control circuitry with an output of the P-type control circuitry to develop a bias signal configured to provide a current limiting function to the bi-directional switch.

\* \* \* \* \*